(12) United States Patent
Sasaki et al.

(10) Patent No.: US 8,174,261 B2
(45) Date of Patent: May 8, 2012

(54) MAGNETIC FILM SENSOR WITH A DEFORMABLE PART

(75) Inventors: Yoshitaka Sasaki, Santa Clara, CA (US); Koji Shimazawa, Saku (JP); Tatsushi Shimizu, Hong Kong (CN)

(73) Assignees: Headway Technologies, Inc., Milpitas, CA (US); SAE Magnetics (H.K.) Ltd., Hong Kong (CN); Koji Shimazawa, Saku-shi (JP)

( * ) Notice: Subject to any disclaimer, the term of this patent is extended or adjusted under 35 U.S.C. 154(b) by 0 days.

(21) Appl. No.: 12/725,935

(22) Filed: Mar. 17, 2010

(65) Prior Publication Data

US 2010/0182003 A1 Jul. 22, 2010

Related U.S. Application Data

(62) Division of application No. 11/585,117, filed on Oct. 24, 2006, now Pat. No. 7,750,627.

(51) Int. Cl.
*G01R 33/02* (2006.01)
(52) U.S. Cl. ...................................................... 324/252
(58) Field of Classification Search ................... 324/252
See application file for complete search history.

(56) References Cited

U.S. PATENT DOCUMENTS

| | | | |
|---|---|---|---|
| 4,412,454 A | 11/1983 | Yamashita et al. | |
| 5,206,590 A | 4/1993 | Dieny et al. | |
| 5,355,714 A | 10/1994 | Suzuki et al. | |
| 5,422,571 A | 6/1995 | Gurney et al. | |
| 5,989,690 A | 11/1999 | Fujikata et al. | |
| 6,338,899 B1 | 1/2002 | Fukuzawa et al. | |
| 7,026,696 B2 | 4/2006 | Shimokohbe et al. | |
| 7,132,722 B2 | 11/2006 | Ohashi | |
| 7,319,322 B2 | 1/2008 | Schmitt et al. | |
| 7,490,522 B2 * | 2/2009 | Ruehrig et al. | 73/862.335 |
| 7,583,081 B2 * | 9/2009 | Schmitt et al. | 324/252 |
| 2006/0033133 A1 | 2/2006 | Liu et al. | |
| 2006/0246271 A1 | 11/2006 | Quandt et al. | |
| 2007/0186666 A1 | 8/2007 | Ruehrig et al. | |

FOREIGN PATENT DOCUMENTS

| | | |
|---|---|---|
| JP | A-54-113379 | 9/1979 |
| JP | A-62-191731 | 8/1987 |
| JP | A-04-346278 | 12/1992 |
| JP | A-05-335284 | 12/1993 |
| JP | A-6-236527 | 8/1994 |
| JP | A-06-302834 | 10/1994 |

(Continued)

OTHER PUBLICATIONS

Office Action issued in JP Application No. 2007-230674 on Apr. 12, 2011 (with English translation).

*Primary Examiner* — Jay Patidar
(74) *Attorney, Agent, or Firm* — Oliff & Berridge, PLC

(57) ABSTRACT

A magnetic film sensor comprises a magnetic film for generating a magnetostriction, and a magnetostrictive structure for generating a magnetostriction in the magnetic film. The magnetostrictive structure is constructed so as to generate a magnetostriction by curving the magnetic film, for example. The magnetostrictive structure is obtained, for example, by providing a depressed insulating layer having a surface formed with a depression and forming the magnetic film across the depression. A deformable part that is formed using a softer material than the magnetic film may also be formed at least partly on a surface of the magnetostrictive structure, within the depression.

7 Claims, 35 Drawing Sheets

FOREIGN PATENT DOCUMENTS

| | | |
|---|---|---|
| JP | A-07-209128 | 8/1995 |
| JP | B2-08-21166 | 3/1996 |
| JP | A-2000-137906 | 5/2000 |
| JP | A-2002-148132 | 5/2002 |
| JP | A-2002-357488 | 12/2002 |
| JP | A-2003-037312 | 2/2003 |

* cited by examiner

Fig.1
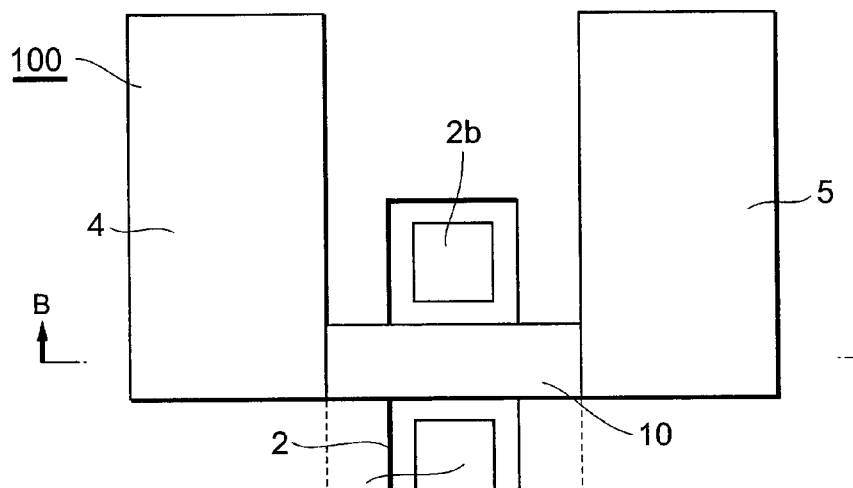
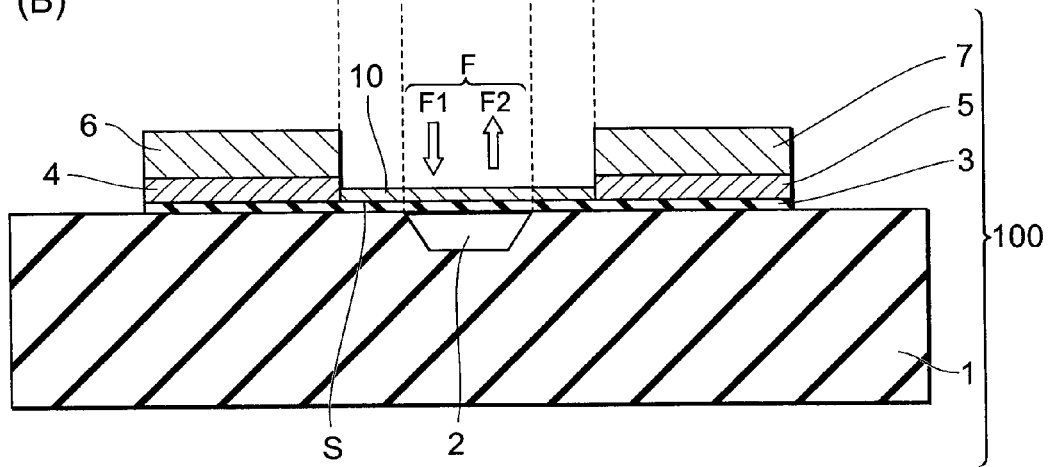

Fig.11
(A)
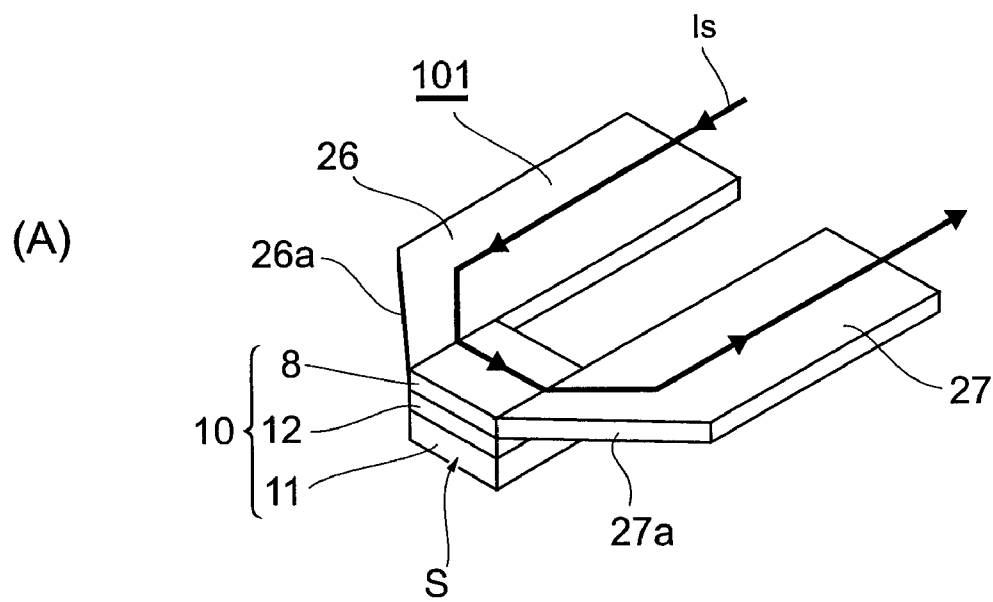
(B)
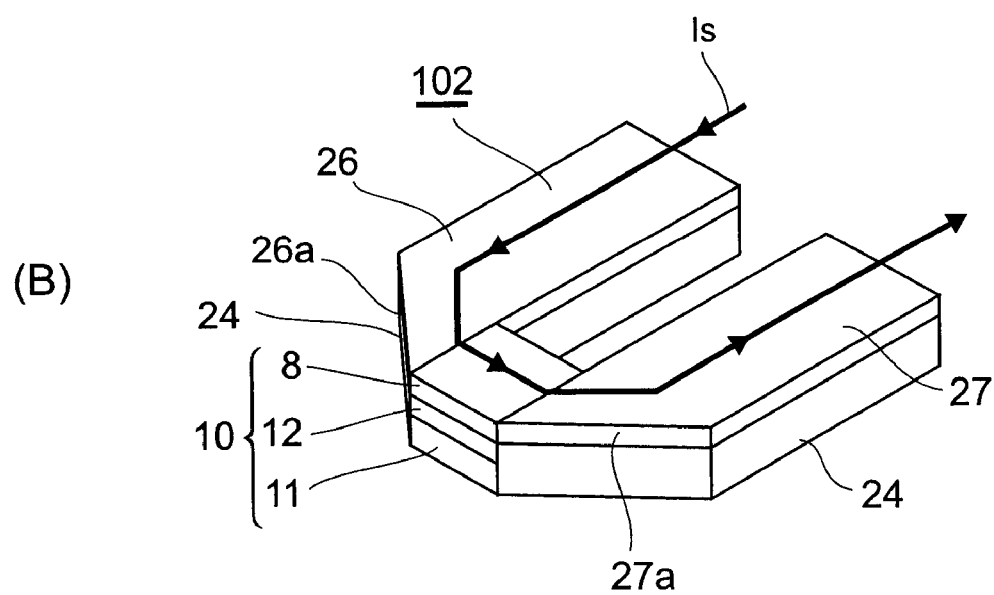

Fig.16
(A)
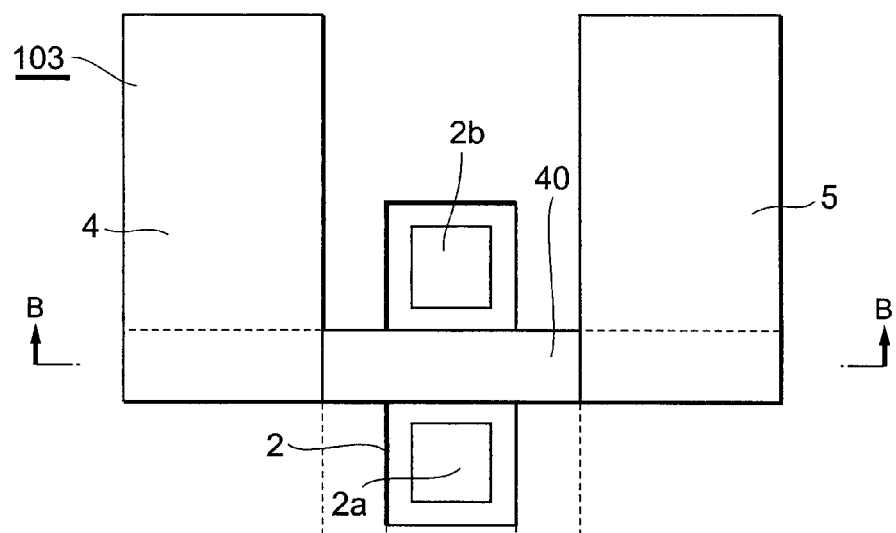
(B)
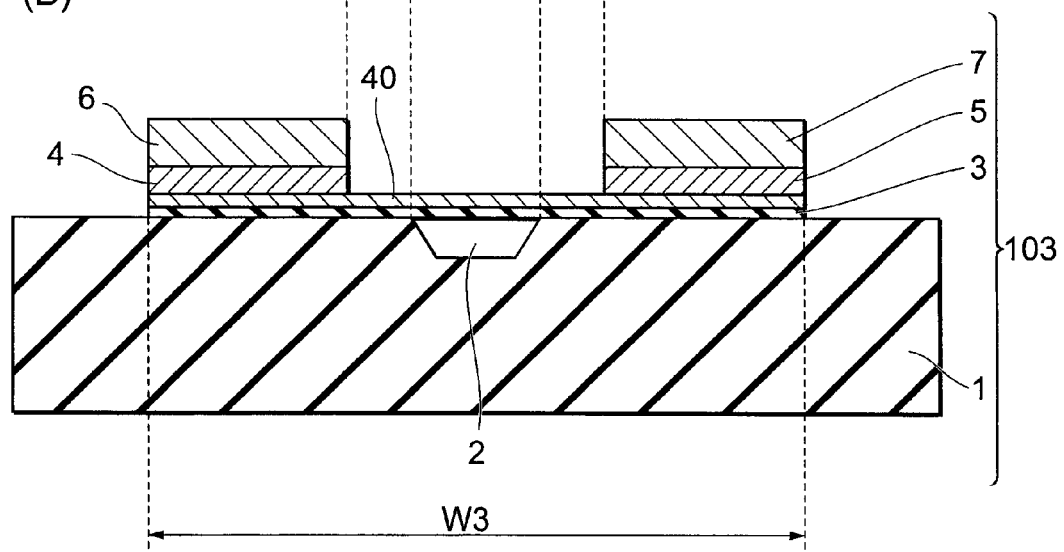

Fig.24
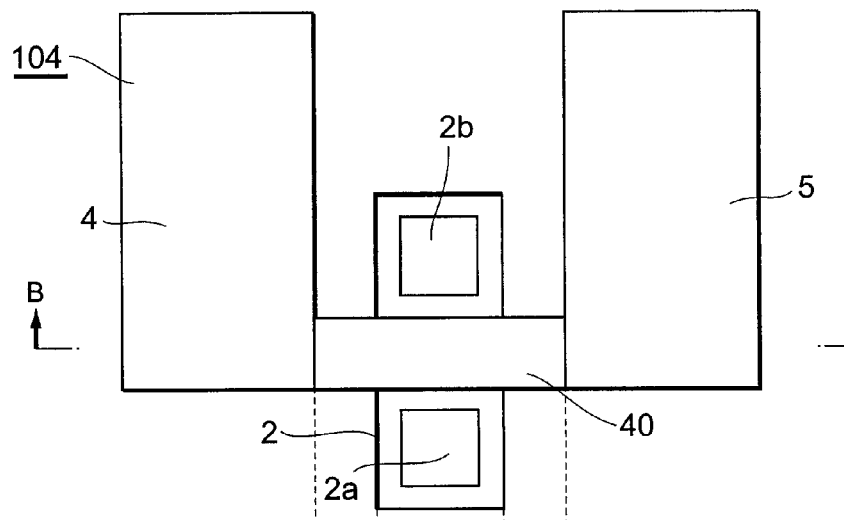
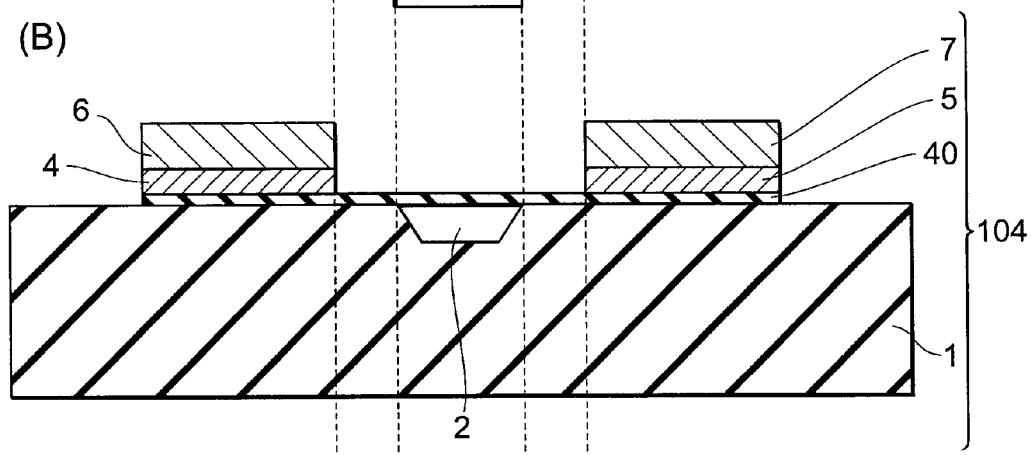
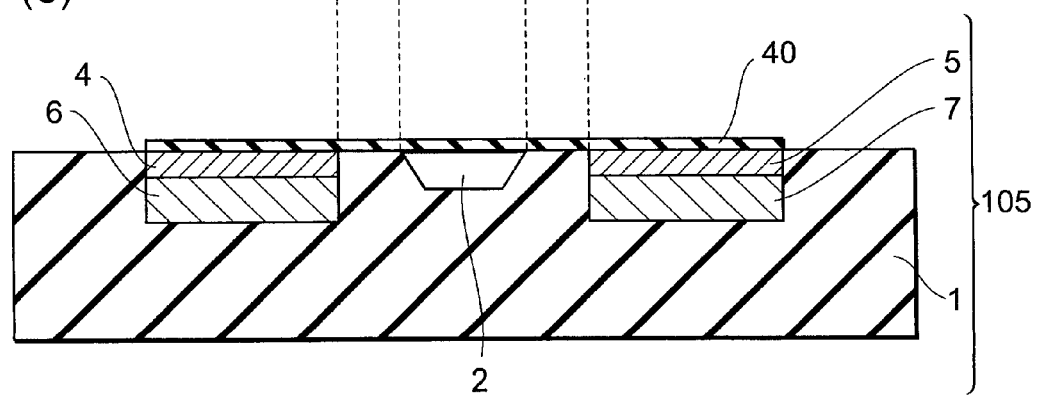

Fig.35
CONVENTIONAL ART
(A)
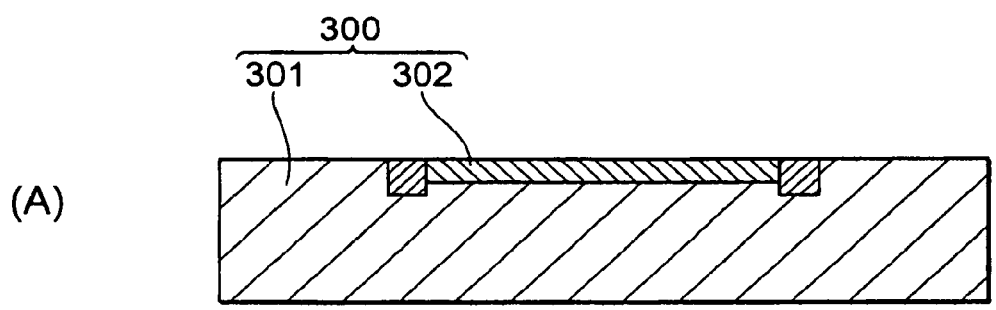
(B)
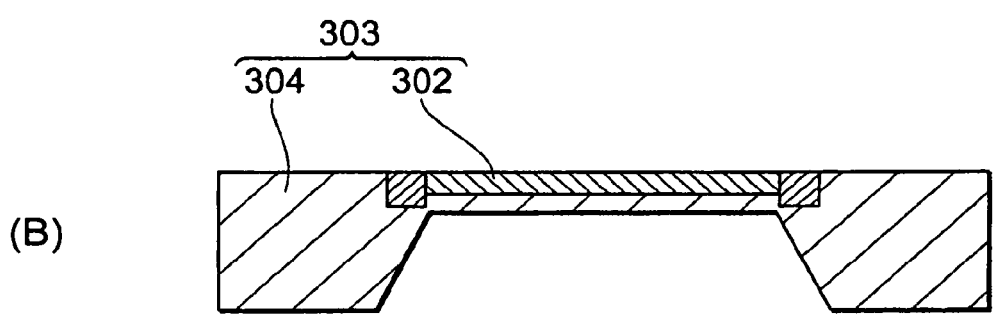

MAGNETIC FILM SENSOR WITH A DEFORMABLE PART

This application is a division of U.S. patent application Ser. No. 11/585,117, filed Oct. 24, 2006, the entire contents of which are hereby incorporated by reference.

BACKGROUND OF THE INVENTION

1. Field of the Invention

The present invention relates to a magnetic film sensor using a magnetic film such as GMR, AMR, TMR, and MR films and a method of manufacturing the same.

2. Related Background Art

Recently, sensors have been in use in various fields, and demands therefor have greatly been increasing. For example, acceleration sensors employing a MEMS (Micro Electro Mechanical Systems) technology have been mounted in digital media products such as cellular phones, notebook personal computers, digital cameras, and portable music players.

They have also been employed in the forms of pressure sensors, temperature sensors, and acceleration sensors in the field of car electronics, whereas image sensors have been mounted in cellular phones, digital cameras, and the like. Further, various sensors have been in use along with the MEMS technology in the aerospace field or military industry.

In particular, a number of sensors applying the MEMS technology have been employed in commercial products, and their application has been advancing in various forms such as sensors for robots and pressure sensors for car tires.

The sensors using the MEMS technology thus include various types of sensors such as pressure sensors, temperature sensors, and acceleration sensors. The following will explain the structure, operation, and the like of a pressure sensor by way of example among them.

SUMMARY OF THE INVENTION

A conventional pressure sensor has a structure in which a pressure-sensitive element therewithin mainly converts changes in the air pressure into an electric signal and outputs the resulting signal. This kind of pressure sensor outputs an electric signal indicative of the fact that the pressure applied from the outside exceeds a preset level, and has been used for various purposes such as suction verification and seating verification utilizing air pressure, leak test, and source pressure management, for example. Known as examples of pressure sensors of this kind are a pressure sensor 300 shown in FIG. 35(A) and a pressure sensor 303 shown in FIG. 35(B).

Here, FIG. 35 is a sectional view schematically showing an example of structures of conventional pressure sensors, in which (A) is a sectional view schematically showing the structure of the pressure sensor 300, whereas (B) is a sectional view showing the structure of the pressure sensor 303.

As shown in FIG. 35(A), each of the pressure sensors 300 and 303 has a structure in which a strain resistance is formed on a silicon chip. In each of the pressure sensors 300 and 303, when a pressure is exerted in a fixed direction and distorts the silicon chip, the resistance value of strain resistance changes. Each of the pressure sensors 300 and 303 converts this resistance change into an electric signal and outputs the resulting signal, thereby detecting the pressure.

A strain resistance 302 is formed on a silicon chip 301 in the pressure sensor 300, whereas a strain resistance 302 is formed on a silicon chip 304 in the pressure sensor 303. In the silicon chip 304, the rear side not formed with the strain resistance 302 is removed by etching or the like, so as to form a thinned part in order to make it easier for the strain resistance 302 to sense the pressure.

When a pressure is applied to the thinned part in the pressure sensor 304, the strain resistance 302 is more likely to deform and change its resistance value than in the pressure sensor 300. Therefore, the pressure sensor 303 can detect the pressure more easily than the pressure sensor 300 does.

The pressure sensors 300 and 303 have been employed not only as pressure sensors for detecting the air pressure, water pressure, and the like, but also in pressure control systems for tires running. In particular, they have been employed as sensors such as touch sensors for robots which require a high sensitivity.

However, there has been a limit to raising the pressure detection accuracy in conventional pressure sensors having structures such as those of the pressure sensors 300 and 303. This point will now be explained in terms of the case where a conventional pressure sensor is utilized as a touch sensor for a robot by way of example.

The robots include those acting as human hands and assisting actions of human hands. Touch sensors employed in such robots are required to have safety, functionality, and higher sensitivity.

While it has been considered one of the largest tasks for robots to bear feels of human hands, the field of their application greatly varies depending on performances of touch sensors. Examples of fields where the robots are utilized include the care and assistance and the lifesaving at the time when fires and disasters occur. The touch sensors must have such a sensitivity that the robots can exhibit performances required in their corresponding fields of application.

The robots in the field of care and assistance place a premium on safety and require high reliability, whereby their touch sensors need a sensitivity corresponding to these demands. The robots in the field of lifesaving require speedy actions and durability in places where human beings cannot approach, whereby their touch sensors necessitate a sensitivity which matches these demands.

However, a robot is equipped with various kinds of sensors including touch sensors, and its behaviors and performances are determined by data obtained from the individual sensors, whereby the touch sensors are required to raise their sensitivity in order to make it possible for the robot to exhibit performances demanded in its field of application.

On the other hand, touch sensors of the robot are required to detect such subtle forces of whether touched or not, which has made it necessary to combine a large number of touch sensors in a complicated fashion. Even in this case, however, many improvements have been necessary in the touch sensors in order for the robot to bear feels of sensitive human hands.

As in the foregoing, there has been a limit to raising the sensitivity in the conventional pressure sensors having structures such as those of the pressure sensors 300 and 303. In particular, there has been a limit to exhibiting the sensitivity necessary for touch sensors of robots.

High-sensitivity sensors (pressure sensors, temperature sensors, and acceleration sensors) have conventionally been demanded in not only robots necessitating high-sensitivity sensors, but also in the field of car electronics requiring safety, various electric home appliances, medical instruments for blood pressure measurement, and the like. Therefore, the advent of new high-sensitivity sensors applying a MEMS technology based on an operation principle different from that of the conventional sensors has been awaited.

For solving the problem mentioned above, it is an object of the present invention to provide a high-sensitivity sensor applying a MEMS technology based on an operation principle different from that of the conventional sensors and a method of manufacturing the same.

For achieving the above-mentioned object, in one aspect, the present invention provides a magnetic film sensor comprising a spin-valve film for generating a magnetostriction, and a magnetostrictive structure for generating a magnetostriction in the spin-valve film.

When a mechanical strain is exerted on the spin-valve film in this magnetic film sensor, the magnetization of the spin valve changes. Also, the magnetic film sensor has the magnetostrictive structure, whereby a mechanical strain is exerted on the spin-valve film.

The magnetostrictive structure may be constructed so as to generate the magnetostriction by curving the spin-valve film.

The spin-valve film may be constructed so as to change a resistance value according to the magnetostriction.

In another aspect, the present invention provides a magnetic film sensor comprising a magnetic film and a depressed insulating layer having a surface formed with a depression, the magnetic film being formed on the depressed insulating layer so as to stride across the depression.

Since the magnetic film is formed so as to stride across the depression in this magnetic film sensor, even a weak external force deforms the magnetic film.

In still another aspect, the present invention provides a magnetic film sensor comprising a magnetic film and a base layer having a surface at least partly forming a deformable part softer than the magnetic film, the magnetic film being formed on the base layer so as to stride across the deformable part.

Since the magnetic film is formed so as to stride across the deformable part softer than the magnetic film in this magnetic film sensor, even a weak external force deforms the magnetic film.

The magnetic film sensor may further comprise a buffer insulating layer formed on the surface of the depressed insulating layer so as to stride across the depression, the magnetic film being formed on the buffer insulating layer.

The magnetic film sensor may further comprise a buffer insulating layer formed on the surface of the base layer so as to stride across the deformable part, the magnetic film being formed on the buffer insulating layer.

The magnetic film sensor may further comprise first and second permanent magnet layers for applying a magnetic field along a direction across the depression, the first and second permanent magnet layers being arranged on respective sides of the magnetic film in the direction across the depression.

The magnetic film sensor may further comprise first and second permanent magnet layers for applying a magnetic field along a direction across the deformable part, the first and second permanent magnet layers being arranged on respective sides of the magnetic film in the direction across the deformable part.

The magnetic film sensor may further comprise first and second electrodes for energizing the magnetic film, the first and second electrodes being arranged on respective sides of the magnetic film in the direction across the depression.

The magnetic film sensor may further comprise first and second electrodes for energizing the magnetic film, the first and second electrodes being arranged on respective sides of the magnetic film in the direction across the deformable part.

The magnetic film sensor may be such that a track width of the magnetic film in the direction across the depression is formed greater than a length in a direction intersecting the track width.

The magnetic film may have a structure in which an insulating layer is held between one of GMR, AMR, MR, TMR, and CPP films and a permanent magnet layer made of a permanent magnet.

The magnetic film may have a structure in which a free magnetization layer whose orientation of magnetization varies according to a change in the track width in the direction across the depression, and a fixed magnetization layer whose orientation of magnetization is unchangeable are laminated.

The magnetic film sensor may further comprise first and second permanent magnet layers for applying a magnetic field to the magnetic film along the direction across the depression, the magnetic film having a structure in which an insulating layer is held between a GMR film and a bias magnetic field layer for applying a magnetic field in a direction intersecting the magnetic field applied by the first and second permanent magnet layers to the GMR film.

The magnetic film sensor may further comprise first and second permanent magnet layers for applying a magnetic field to the magnetic film along the direction across the deformable part, the magnetic film having a structure in which an insulating layer is held between a GMR film and a bias magnetic field layer for applying a magnetic field in a direction intersecting the magnetic field applied by the first and second permanent magnet layers to the GMR film.

The magnetic film sensor may further comprise a third permanent magnet layer for connecting the first and second permanent magnet layers to each other, and a thin-film coil wound about one of the first, second, and third permanent magnet layers.

The magnetic film sensor may further comprise a bimetal formed on the surface of the depressed insulating layer so as to stride across the depression, the magnetic film being formed on the bimetal.

The magnetic film sensor may have a structure in which a photoresist is buried in the depression.

In still another aspect, the present invention provides a method of manufacturing a magnetic film sensor comprising a magnetic film and a depressed insulating layer having a surface formed with a depression, the method comprising the following steps (1) to (3):

(1) forming a depression on a surface of an insulating layer so as to yield the depressed insulating layer;

(2) applying a photoresist filling the depression to the surface of the insulating layer and then forming the magnetic film across the depression on the surface of the depressed insulating layer; and (3) performing liftoff so as to remove the photoresist buried in the depression.

In still another aspect, the present invention provides a method of manufacturing a magnetic film sensor comprising a magnetic film and a depressed insulating layer having a surface formed with a depression, the method comprising the following steps (4) to (8):

(4) forming a depression on a surface of an insulating layer so as to yield the depressed insulating layer;

(5) applying a photoresist filling the depression to the surface of the insulating layer and then forming a coating made of an insulating material on the surface of the depressed insulating layer;

(6) polishing the coated surface of the depressed insulating layer by CMP;

(7) forming the magnetic film across the depression on the surface of the depressed insulating layer polished by CMP; and (8) performing liftoff so as to remove the photoresist buried in the depression.

The method may further comprise the step of forming a magnetic layer made of a magnetic material and a conductive layer made of a conductive material on the surface of the depressed insulating layer between the step of forming the magnetic film and the step of removing the photoresist.

The step of forming the magnetic film may form a buffer insulating layer across the depression on the surface of the depressed insulating layer after applying the photoresist filling the depression, and form the magnetic film in contact with the buffer insulating layer.

The present invention will be more fully understood from the detailed description given hereinbelow and the accompanying drawings which are given by way of illustration only, and thus are not to be considered as limiting the present invention.

BRIEF DESCRIPTION OF THE DRAWINGS

FIG. 1 shows a magnetic film sensor in accordance with a first embodiment, in which (A) is a plan view illustrating a major part of the magnetic film sensor, and (B) is a sectional view taken along the line B-B of (A);

FIG. 11 is a perspective view schematically showing magnetic film sensors in accordance with modified examples, in which (A) and (B) illustrate magnetic film sensors 101 and 102, respectively;

FIG. 16 shows a magnetic film sensor in accordance with a second embodiment of the present invention, in which (A) is a plan view illustrating a major part of the magnetic film sensor, and (B) is a sectional view taken along the line B-B of (A);

FIG. 24 shows other magnetic film sensors in accordance with the second embodiment of the present invention, in which (A) is a plan view illustrating a major part of a magnetic film sensor, (B) is a sectional view taken along the line B-B of (A), and (C) is a sectional view of another magnetic film sensor similar to (B);

FIG. 35 is a sectional view schematically showing examples of structures of conventional pressure sensors, in which (A) is a sectional view schematically illustrating the structure of a pressure sensor, and (B) is a sectional view showing the structure of another pressure sensor.

DESCRIPTION OF THE PREFERRED EMBODIMENTS

Figure 2:
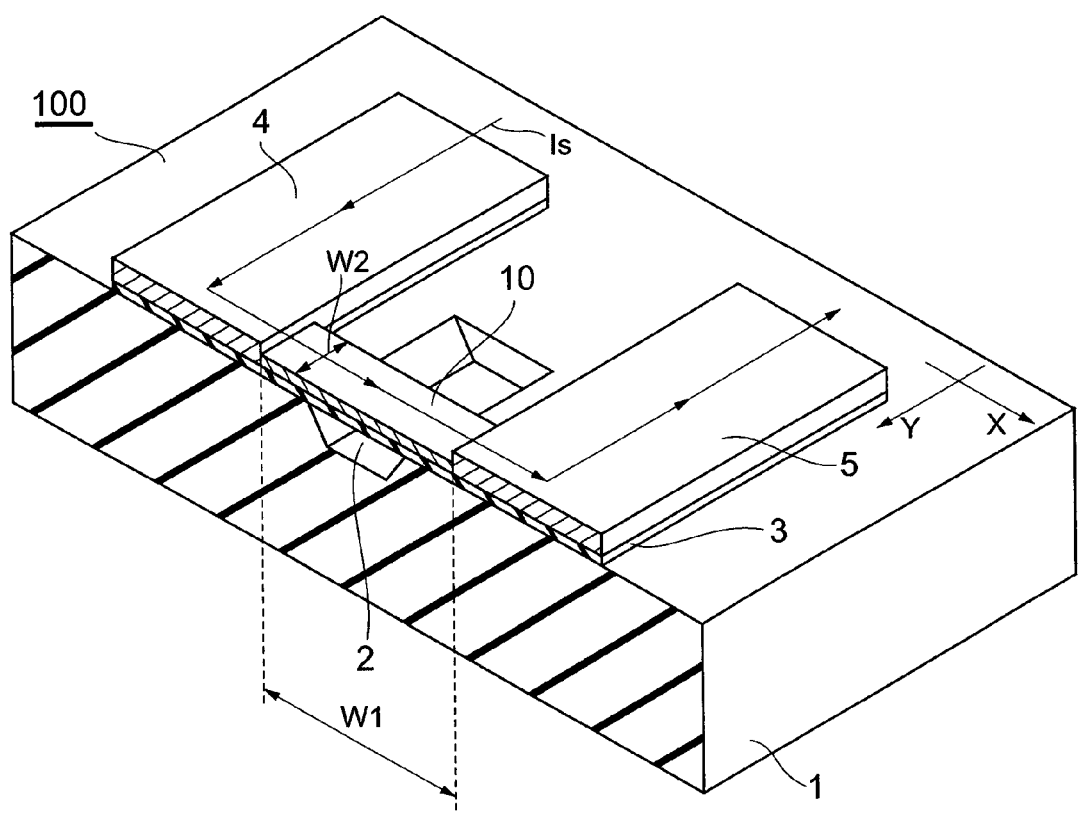
FIG. 2 is a perspective view of the magnetic film sensor in accordance with the first embodiment of the present invention as seen from the cross section in FIG. 1.

In the following, embodiments of the present invention will be explained with reference to the drawings. The same numerals will be used for the same constituents without repeating their overlapping explanations.

The magnetic film sensors in accordance with the embodiments of the present invention have magnetic films which generate a magnetostriction. An example of the magnetic films is a sensor film 10 in a first embodiment which will be explained later. The magnetic films of the magnetic film sensors are also referred to as a spin-valve film, which has an antiferromagnetic layer, a ferromagnetic layer, a nonmagnetic metal layer, and a ferromagnetic layer. The magnetic film also generates a magnetostriction which will be explained later in detail. Therefore, the magnetization of the magnetic film changes when mechanical strains such as curve, bend, and expansion are exerted on the magnetic film. By utilizing this property, the magnetic film sensor can detect a mechanical change as an electric change. The magnetic film sensor 100 to be explained later changes its resistance value according to the magnetostriction.

The magnetic film sensor has a magnetostrictive structure. The magnetostrictive structure is a structure for generating a magnetostriction by applying a mechanical strain such as curve, bend, or expansion to the magnetic film. Examples of the structure include one in which the sensor film 10 is provided so as to stride across a cavity 2 as in the magnetic film sensor 100, one in which a sensor film 40 deforms as a photoresist 31 inflates as in a magnetic film sensor 106, and one in which a sensor film 40 overlies a bimetal layer 50 as in a magnetic film sensor 107, which will be explained later. Of course, the magnetostrictive structure is not limited to the structures disclosed in the following first to sixth embodiments as long as it is a structure which can exert a mechanical strain such as curve, bend, and expansion to the magnetic film.

The magnetic film sensors in accordance with the embodiments of the present invention generate a magnetostriction when a mechanical strain such as curve, bend, or expansion is exerted on the magnetic films even if the mechanical strain is very small. Therefore, the magnetic film sensors can detect a very small mechanical change as an electric change and thus become sensors having a very high sensitivity. In particular, they can further raise the detection sensitivity by using a GMR, TMR, MR, or CPP (Current Perpendicular Plane) film and the like as in the magnetic film sensor 100 to be explained later.

Specific structures, operations, effects, and the like of the magnetic film sensors in accordance with the embodiments of the present invention will now be explained in detail.

First Embodiment

Structure of Magnetic Film Sensor

To begin with, the structure of the magnetic film sensor 100 in accordance with the first embodiment of the present invention will be explained with reference to FIGS. 1 and 2. FIG. 1 shows the magnetic film sensor 100 in accordance with the first embodiment of the present invention, in which (A) is a plan view illustrating a major part of the magnetic film sensor 100, and (B) is a sectional view taken along the line B-B of (A). FIG. 2 is a perspective view of the magnetic film sensor 100 as seen from the cross section in FIG. 1. For convenience of illustration, FIG. 1(A) omits an insulating layer 1 which will be explained later, whereas FIG. 2 omits electrodes 6, 7.

The magnetic film sensor 100 has a sensor film 10 as a magnetic film including a GMR (Giant Magneto Resistive) film 8. The magnetic film sensor 100 is a pressure sensor which detects an external pressure F by utilizing a property of the sensor film 10 changing its resistance value according to the pressure F.

The magnetic film sensor 100 has the insulating layer 1 as a base layer, a buffer insulating layer 3 directly in contact with the surface of the insulating layer 1, and the sensor film 10 directly formed on the buffer insulating layer 3. The magnetic film sensor 100 has permanent magnet layers 4, 5 as first and second permanent magnet layers and the electrodes 6, 7 as first and second electrodes.

The insulating layer 1 is a depressed insulating layer, made of an insulating material such as alumina ($Al_2O_3$) or $SiO_2$, having a cavity 2 as a depression formed at the center of the width on one surface.

The cavity 2 is formed with predetermined width, length, and depth on the surface of the insulating layer 1, while having depressed holes 2a, 2b with a predetermined size at the bottom part. The holes 2a, 2b are arranged such as to oppose each other longitudinally across the sensor film 10.

The buffer insulating layer 3 and sensor film 10 are arranged such as to stride across the cavity 2, whereas the permanent magnet layers 4, 5 are arranged on both sides of the sensor film 10 in the direction across the cavity 2 (referred to as width direction, in which the direction from the permanent magnet 4 to permanent magnet 5 will also be referred to as "X direction"). In this embodiment, the sensor film 10 is arranged orthogonal to the longitudinal direction of the cavity 2.

The buffer insulating layer 3 is a thin film made of an insulating material such as alumina ($Al_2O_3$) or $SiO_2$, and is shaped into a form corresponding to the sensor film 10 and permanent magnet layers 4, 5. The permanent magnet layers 4, 5 are formed in direct contact with parts of the buffer insulating layer 3 which are not in contact with the sensor film 10.

The permanent magnet layers 4, 5 are thin films made of permanent magnets, and are in contact with end face parts on both sides of the sensor film 10 in the width direction. The permanent magnet layers 4, 5 apply a magnetostatic field H3, which will be explained later, to the sensor film 10.

The electrodes 6, 7 are made of metals with favorable conductivity, and have forms corresponding to the permanent magnet layers 4, 5. The electrodes 6, 7 are formed on the permanent magnet layers 4, 5, respectively. The electrodes 6, 7 are provided in order for a sense current Is, which will be explained later, to flow through the sensor film 10.

Structure of Sensor Film 10

The sensor film 10 is a thin film formed into a rectangular shape having a width (track width) of W1 and a length of W2 in a direction intersecting the width direction (referred to as longitudinal direction, in which the direction toward the cross section of FIG. 1(B) will be referred to as "Y direction"). In this embodiment, the track width W1 is set to about 100 nm, whereas the length W2 is set shorter than the track width W1 (W1>W2).

Figure 3:
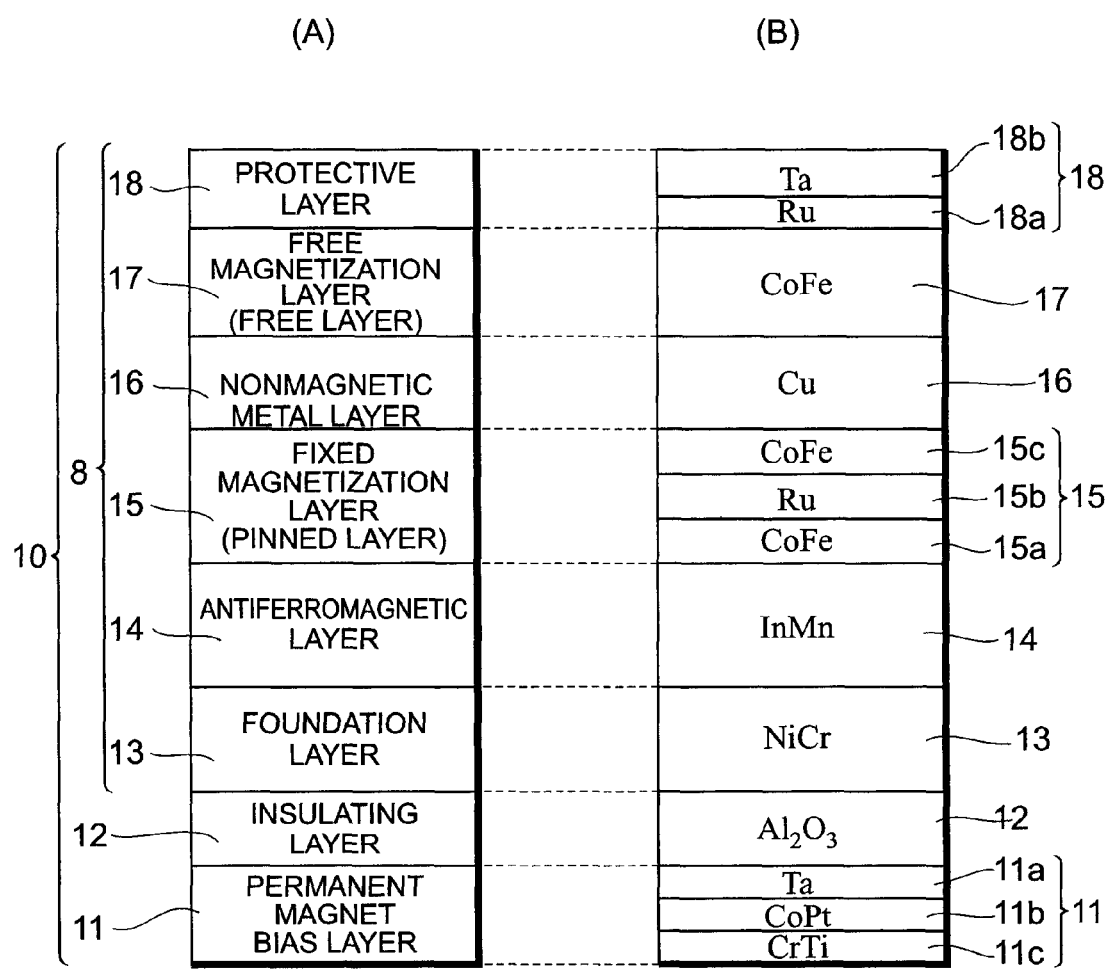
FIG. 3 is a sectional view schematically showing the multilayer structure of a sensor film, in which (A) is a sectional view functionally dividing the layers constituting the sensor film, and (B) is a sectional view showing the multilayer structure of the sensor film together with materials of the layers.
Figure 4:
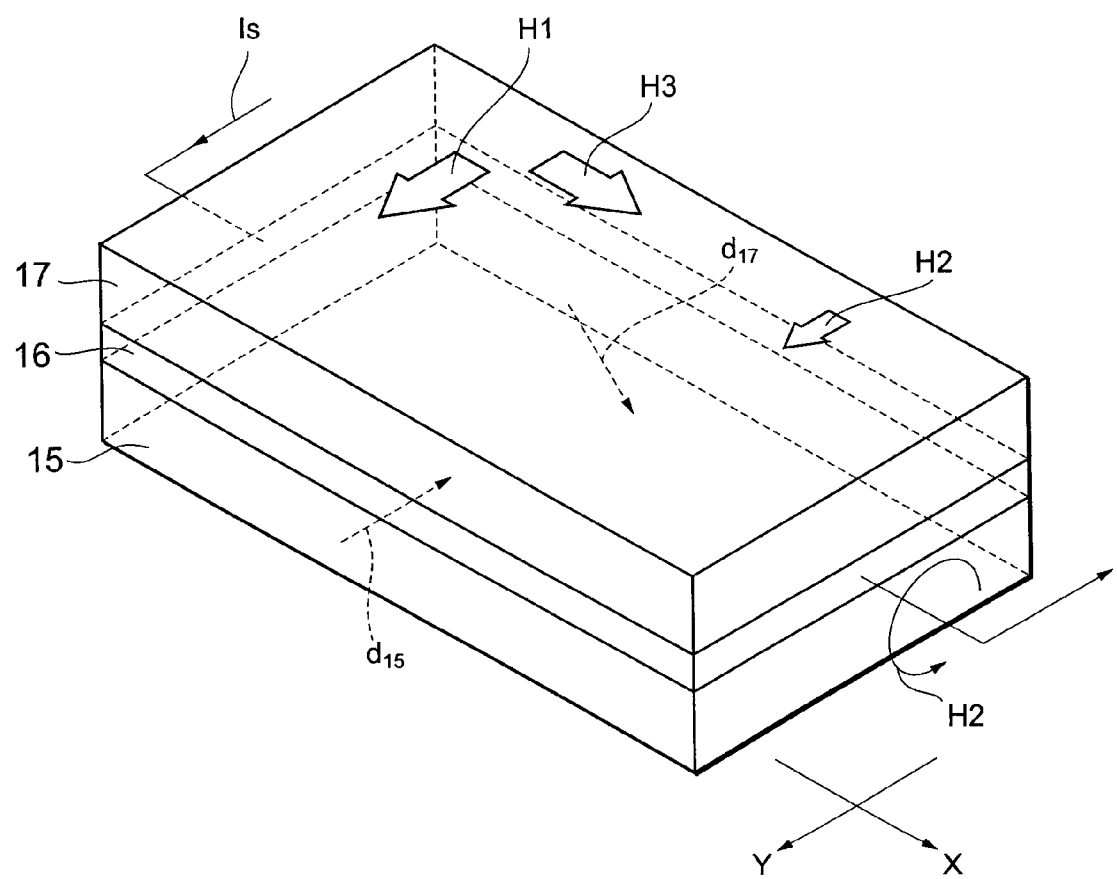
FIG. 4 is a perspective view showing a fixed magnetization layer, a nonmagnetic metal layer, and a free magnetization layer which constitute the sensor film in a laminated state together with their directions of magnetization and magnetic fields.
Figure 5:
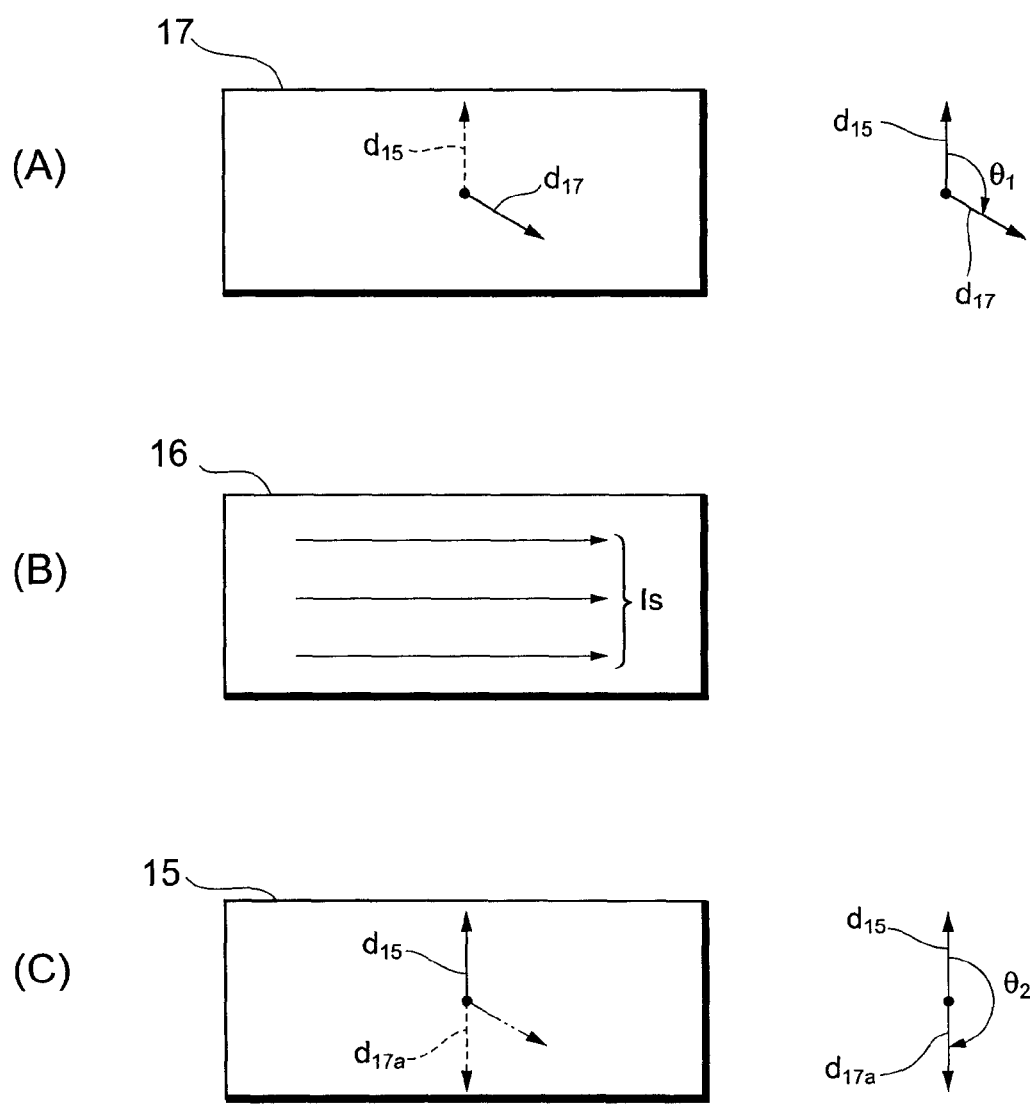
FIG. 5 is a plan view showing the fixed magnetization layer, nonmagnetic metal layer, and free magnetization layer together with their directions of magnetization, in which (A), (B), and (C) illustrate the free magnetization layer, nonmagnetic metal layer, and fixed magnetization layer, respectively.

The sensor film 10 will now be explained in detail with reference to FIGS. 3 to 6. FIG. 3 is a sectional view schematically showing the multilayer structure of the sensor film 10, in which (A) is a sectional view functionally dividing the layers constituting the sensor film 10, and (B) is a sectional view showing the multilayer structure of the sensor film 10 together with materials of the layers. FIG. 4 is a perspective view showing a fixed magnetization layer 15, a nonmagnetic metal layer 16, and a free magnetization layer 17 which constitute the sensor film 10 in a laminated state together with their directions of magnetization and magnetic fields. FIG. 5 is a plan view showing the fixed magnetization layer 15, nonmagnetic metal layer 16, and free magnetization layer 17 together with their directions of magnetization, in which (A), (B), and (C) illustrate the free magnetization layer 17, nonmagnetic metal layer 16, and fixed magnetization layer 15, respectively.

Figure 6:
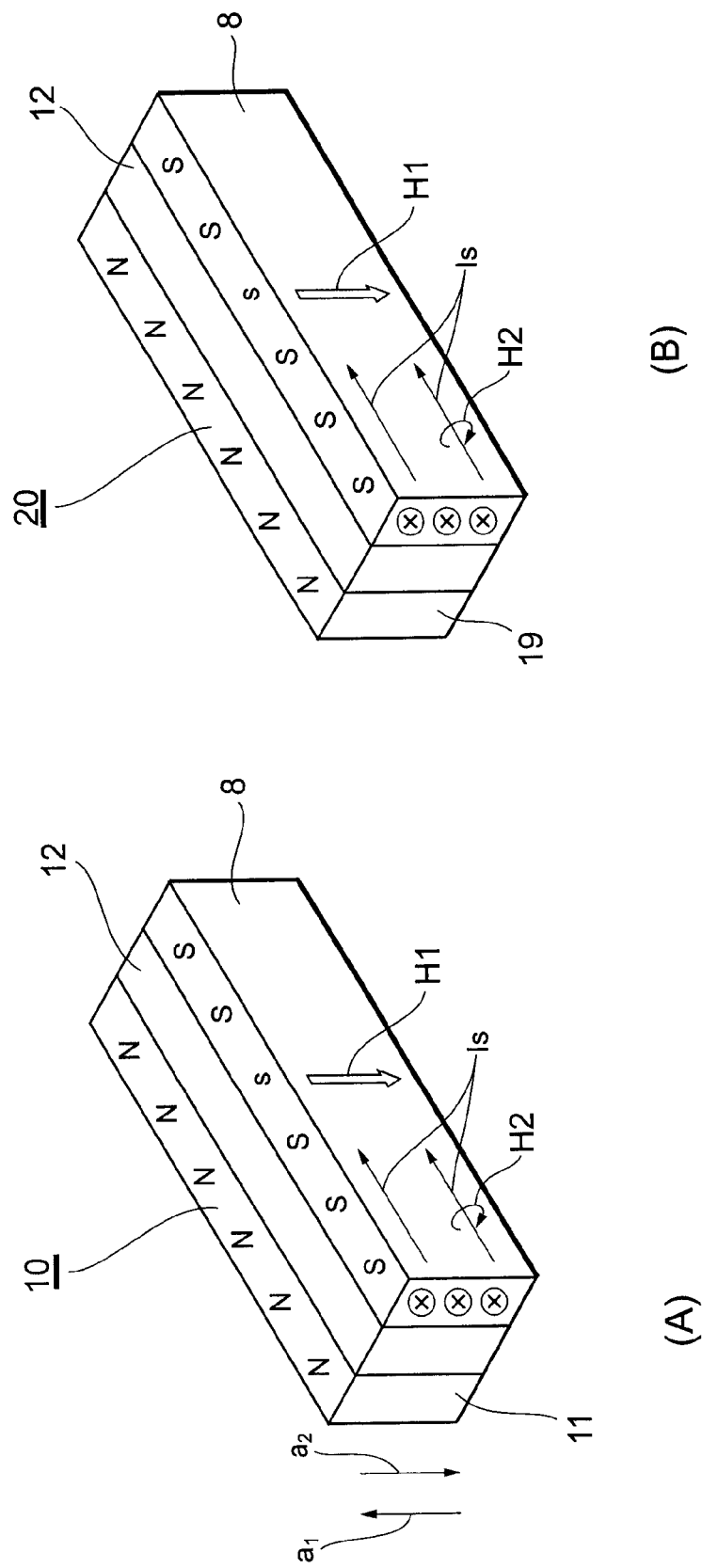
FIG. 6 is a perspective view schematically showing structures of sensor films, in which (A) is a perspective view schematically illustrating the structure of the above-mentioned sensor film, and (B) is a perspective view schematically showing the structure of a sensor film having a soft adjacent layer instead of the permanent magnet layer.

FIG. 6 is a perspective view schematically showing structures of sensor films, in which (A) is a perspective view schematically illustrating the structure of the sensor film 10, and (B) is a perspective view schematically showing the structure of a sensor film 20 having a soft adjacent layer 19 instead of a permanent magnet bias layer 11.

As shown in FIG. 3(A), the sensor film 10 has the GMR film 8, the permanent magnet bias layer 11, and an insulating layer 12, which are laminated in the order of the permanent magnet bias layer 11, insulating layer 12, and GMR film 8. The sensor film 10 is formed such that the permanent magnet bias layer 11 is in direct contact with the buffer insulating layer 3.

The GMR film 8 has a foundation layer 13, an anti ferromagnetic layer 14, the fixed magnetization layer 15, the nonmagnetic metal layer 16, the free magnetization layer 17, and a protective layer 18 which are laminated in this order. As shown in FIG. 4, the sense current Is fed to the nonmagnetic metal layer 16 through the electrodes 6, 7 flows through the GMR film 8, whereas a current magnetic field H2 formed by the sense current Is, which will be explained later, can adjust the orientation of magnetization of the free magnetization layer 17 (as will be explained later in detail). Because of the magnetoresistive effect, the GMR film 8 has a property of changing its resistance value according to the magnitude of magnetic field.

The permanent magnet bias layer 11 is a thin film made of a permanent magnet, and has a three-layer structure constructed by a CrTi layer 11a (with a thickness of about 50 Å) made of CrTi, a CoPt layer 11b (with a thickness of about 300 Å) made of CoPt, and a Ta layer 11c (with a thickness of about 300 Å) made of Ta which are laminated in this order as shown in FIG. 3(B). The permanent magnet bias layer 11 functions as a perpendicular bias magnetic field layer for applying a perpendicular bias magnetic field H1, which will be explained later, to the GMR film 8.

Increasing the thickness of the CoPt layer 11b in the permanent magnet bias layer 11 can enhance the strength of the perpendicular bias magnetic field H1. Decreasing the height of the sensor film 10 and the height of the permanent magnet bias layer 11 can also enhance the strength of the perpendicular bias magnetic field H1. Permalloy can also be used as the material of the CoPt layer 11b.

The insulating layer 12 is made of alumina ($Al_2O_3$) and has a thickness of about 200 Å. The insulating layer 12 is held between the permanent magnet bias layer 11 and GMR film 8 in order to prevent the sense current Is from flowing from the GMR film 8 to the permanent magnet bias layer 11 and thereby causing output loss by shunting to the permanent magnet bias layer 11.

The foundation layer 13 has a single-layer structure made of NiCr with a thickness of about 50 Å. The antiferromagnetic layer 14 has a single-layer structure made of IrMn with a thickness of about 70 Å.

As shown in FIG. 3(B), the fixed magnetization layer 15 has a three-layer structure in which a first CoFe layer 15a made of CoFe (with a thickness of about 15 Å), an Ru layer 15b made of Ru (with a thickness of about 8 Å), and a second CoFe layer 15c made of CoFe (with a thickness of about 20 Å) are laminated in this order (a synthetic pinned structure in which a ferromagnetic material, a nonmagnetic metal material, and a ferromagnetic material are laminated).

In this embodiment, as shown in FIGS. 4 and 5(A), the fixed magnetization layer 15 is set such that the magnetization is oriented in a direction d15. The direction d15 is about 180 degrees opposite from the direction Y toward the cross section of the magnetic film sensor 100 shown in FIG. 1.

The fixed magnetization layer 15 is subjected to predetermined heat treatment (e.g., heating to a temperature of about 250 to 300 degrees for about 2 to 5 hours), magnetized (e.g., by application of an external magnetic field of 5 to 10 kOe), and then bonded to the antiferromagnetic layer 14. Consequently, the fixed magnetization layer 15 forms exchange coupling with the antiferromagnetic layer 14, so that the orientation of magnetization is fixed to a certain direction. Thus, the fixed magnetization layer 15 is a magnetic layer with a fixed direction of magnetization and is thereby also known as a pinned layer.

Forming the fixed magnetization layer 15 into the three-layer structure effectively increases the exchange coupling force as disclosed in Japanese Patent Application Laid-Open No. 2000-137906, for example. The fixed magnetization layer 15 may also have a single-layer structure using a ferromagnetic material.

The nonmagnetic metal layer 16 has a single-layer structure made of Cu with a thickness of about 20 Å. The sense current Is flows through the nonmagnetic metal layer 16. The nonmagnetic metal layer 16 may use Ag or Au in place of Cu.

The free magnetization layer 17 has a single-layer structure made of CoFe (in which the atomic composition ratio of Co/Fe is 60:40) with a thickness of about 50 Å. The magnetization of the free magnetization layer 17 is not fixed, so that the direction of magnetization changes easily according to orientations of magnetic fields applied from the outside (hereinafter referred to as "external magnetic fields", which form a composite magnetic field constituted by the perpendicular bias magnetic field H1, current magnetic field H2, and magnetostatic field H3 from the permanent magnets 4, 5 to be explained later in this embodiment). Therefore, the free magnetization layer 17 can change the direction of magnetization by regulating the sense current Is so as to adjust the size of the current magnetic field H2.

Thus, the free magnetization layer 17 is a magnetic layer whose orientation of magnetization is not fixed, and is thereby also known as a free layer. In this embodiment, magnetic fields applied to the free magnetization layer 17 from the outside by permanent magnets such as the permanent magnet layers 4, 5 and the permanent magnet bias layer 11 are referred to as bias magnetic fields.

In the initial state where no pressure F is exerted from the outside in this embodiment, the free magnetization layer 17 adjusts the value of sense current Is, such that the magnetization is oriented in a direction d17 by an external magnetic field as shown in FIGS. 4 and 5(A). This direction d17 is rotated by about 45 degrees from the X direction to the Y direction.

CoFe constituting the free magnetization layer 17 has a magnetostriction constant of $3 \times 10^{-5}$ in this embodiment. This magnetostriction constant is about 20 times greater than that of a free layer used in a GMR head of a typical HDD (Hard Disk Drive). The magnetostriction constant in CoFe alloys has been known to depend on the composition of Co and Fe. It will be sufficient if materials having greater and smaller magnetostriction constants are chosen respectively when the sensitivity of the sensor film 10 upon application of the pressure F from the outside is to be raised and weakened.

It is desirable for the free magnetization layer 17 to react sensitively to external magnetic fields and minimize its Barkhausen noise. For reducing the Barkhausen noise, for example, a bias magnetic field may be applied to the GMR film 8 in the width W1 direction (this bias magnetic field being also referred to as horizontal bias magnetic field). The horizontal bias magnetic field to the sensor film 10 can be applied by arranging the permanent magnets 4, 5 on both sides of the GMR film 8, for example. Alternatively, though not depicted, a bias magnetic field application layer may be arranged on both sides of the GMR film 8 instead of the permanent magnets 4, 5. This bias magnetic field application layer is constructed by a multilayer body composed of a ferromagnetic layer and an antiferromagnetic layer or the like and has a fixed direction of magnetization.

The protective layer 18 has a two-layer structure in which an Ru layer 18a (with a thickness of about 5 Å) and a Ta layer 18b made of Ta (with a thickness of about 20 Å) are laminated in this order. The protective layer 18 acts to protect the GMR film 8 against the pressure F.

As mentioned above, the sensor film 10 has a structure in which the insulating layer 12 is held between the permanent magnet bias layer 11 and the GMR film 8. One of the greatest merits of this structure lies in that the designing including aspects of processing is relatively easy. When the direction of magnetization to be tilted by a bias magnetic field is $\alpha$, for example, it will be sufficient if the permanent magnet bias layer 11 has a product of residual magnetization and thickness substantially equal to (MS·t) sin $\alpha$ as will be explained later in detail, whereby the principle of designing is simple and clear. Here, MS is the magnitude of saturated magnetization in the GMR film 8, and t is the thickness of the GMR film 8.

Figure 7:
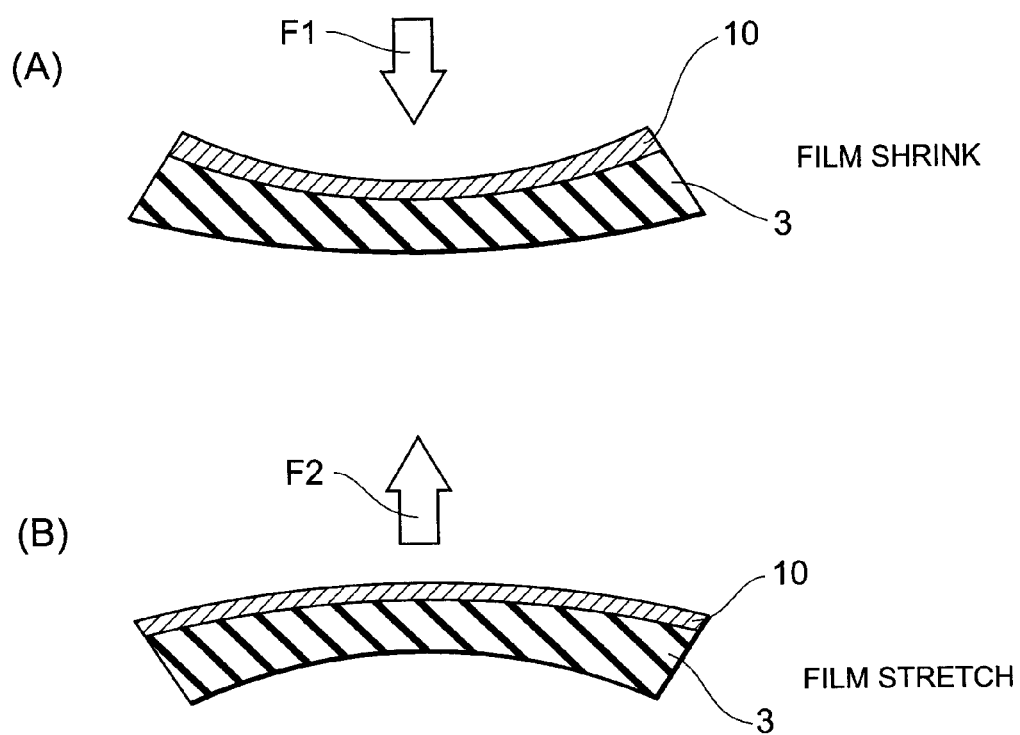
FIG. 7 is a sectional view schematically showing deformed sensor film and buffer insulating layer, in which (A) and (B) illustrate cases where pressures are applied in positive and negative directions, respectively.
Figure 8:
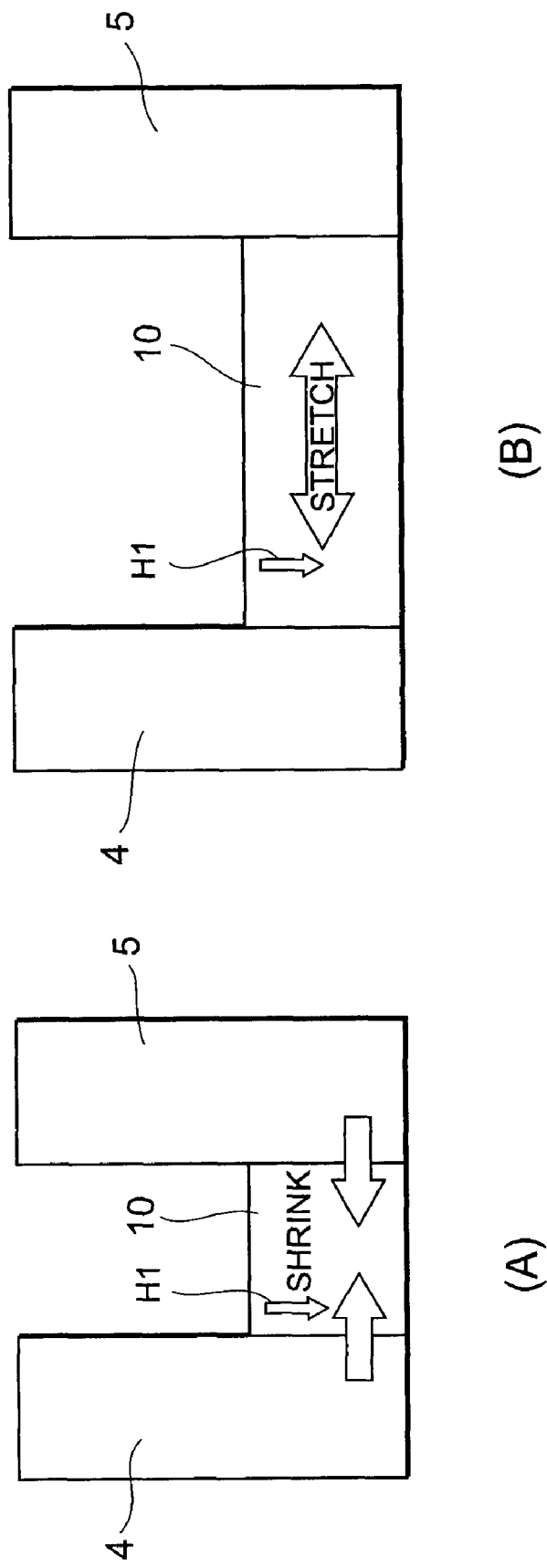
FIG. 8 is a plan view schematically showing the sensor film and permanent magnet layer, in which (A) and (B) illustrate cases where the sensor film is shrunk and stretched, respectively.

The pressure F exerted from the outside and changes in characteristics of the sensor film 10 will now be explained with reference to FIGS. 7 to 10. Here, FIG. 7 is a sectional view schematically showing deformed sensor film 10 and buffer insulating layer 3, in which (A) and (B) illustrate cases where pressures are applied in positive and negative directions, respectively. FIG. 8 is a plan view schematically showing the sensor film 10 and permanent magnet layers 4, 5, in which (A) and (B) illustrate cases where the sensor film 10 is shrunk and stretched, respectively.

Figure 9:
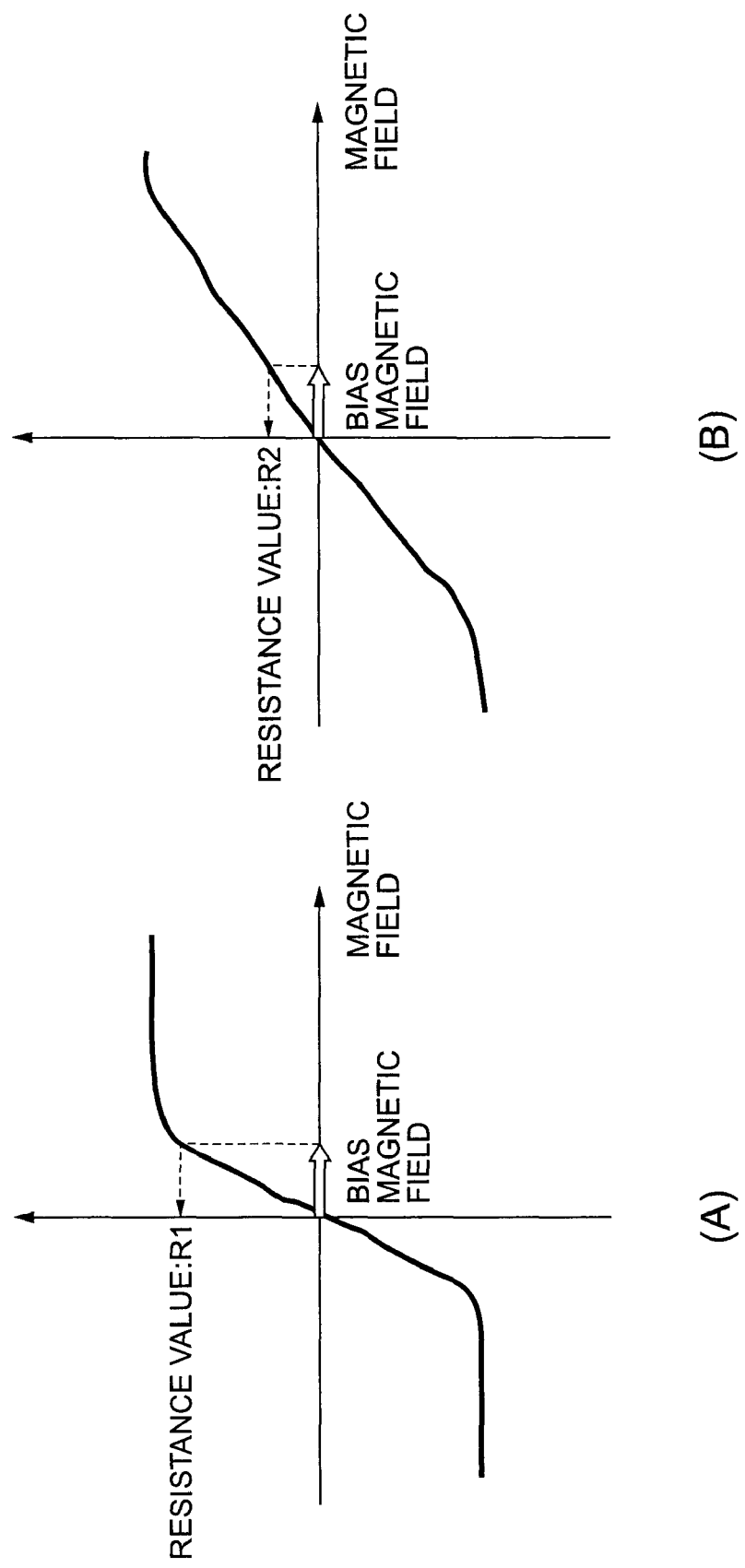
FIG. 9 is a graph showing the relationship between bias magnetic field and resistance value, in which (A) and (B) illustrate cases where the sensor film is shrunk and stretched, respectively.
Figure 10:
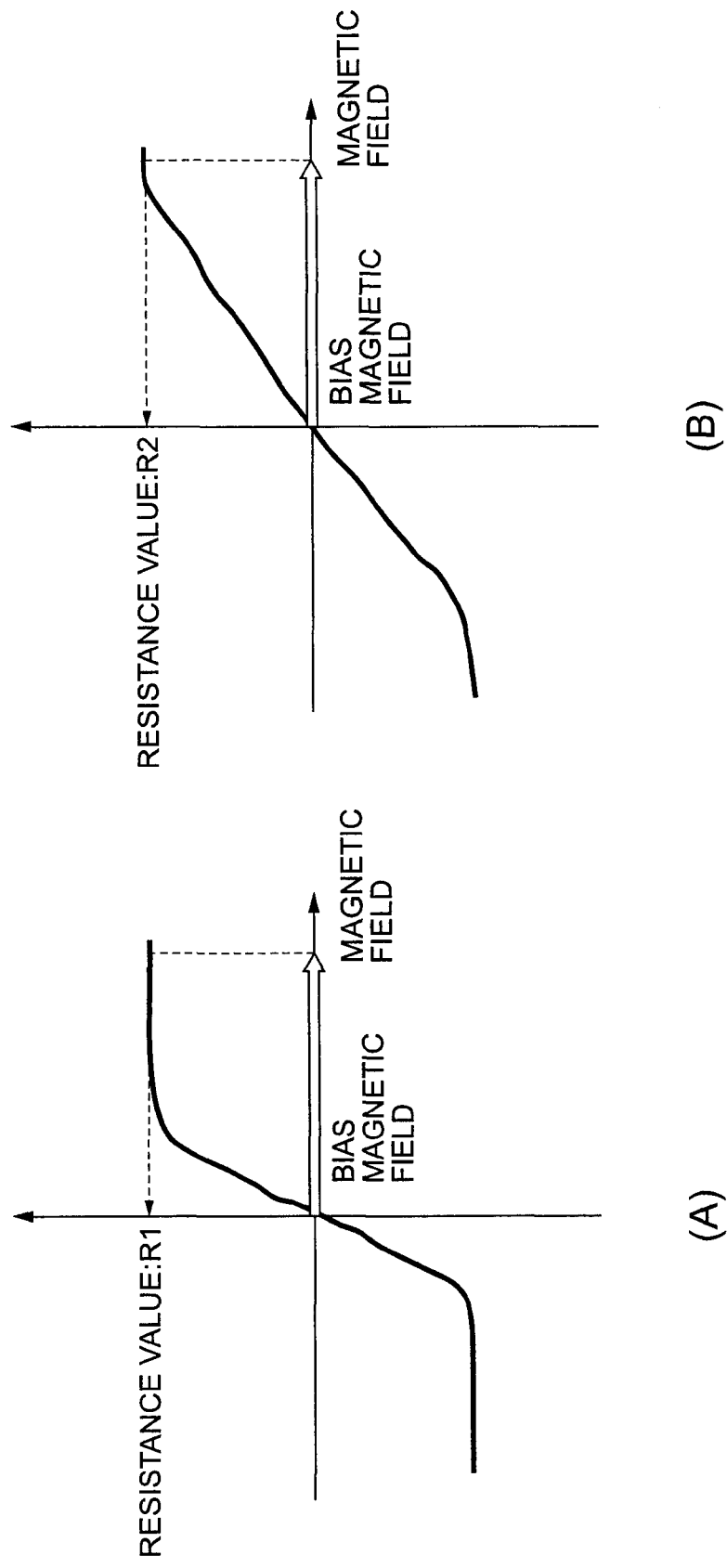
FIG. 10 is another graph showing the relationship between bias magnetic field and resistance value, in which (A) and (B) illustrate cases where the sensor film 10 is shrunk and stretched, respectively.

FIG. 9 is a graph showing the relationship between bias magnetic field and resistance value, in which (A) and (B) illustrate cases where the sensor film is shrunk and stretched, respectively. FIG. 10 is another graph showing the relationship between bias magnetic field and resistance value, in which (A) and (B) illustrate cases where the sensor film 10 is shrunk and stretched, respectively.

Meanwhile, magnetic materials in general have a property of changing their direction of easy magnetization as their length shrinks and stretches. In connection with this property, the magnetic materials have a characteristic parameter of "magnetostriction". The magnetostriction refers to a property in which a ferromagnetic body changes its magnetization when a mechanical strain such as a change in the length is applied thereto and also when a mechanical strain such as a change in length is applied thereto in reverse.

Magnetic materials with a positive value of magnetostriction have such a property that they become easier to magnetize in the direction of expansion when their length is expanded and harder to magnetize in the direction of shrinkage when their length is shrunk. Magnetic materials with a negative value of magnetostriction have such a property that they become harder to magnetize in the direction of expansion when their length is expanded and easier to magnetize in the direction of shrinkage when their length is shrunk.

Figure 34:
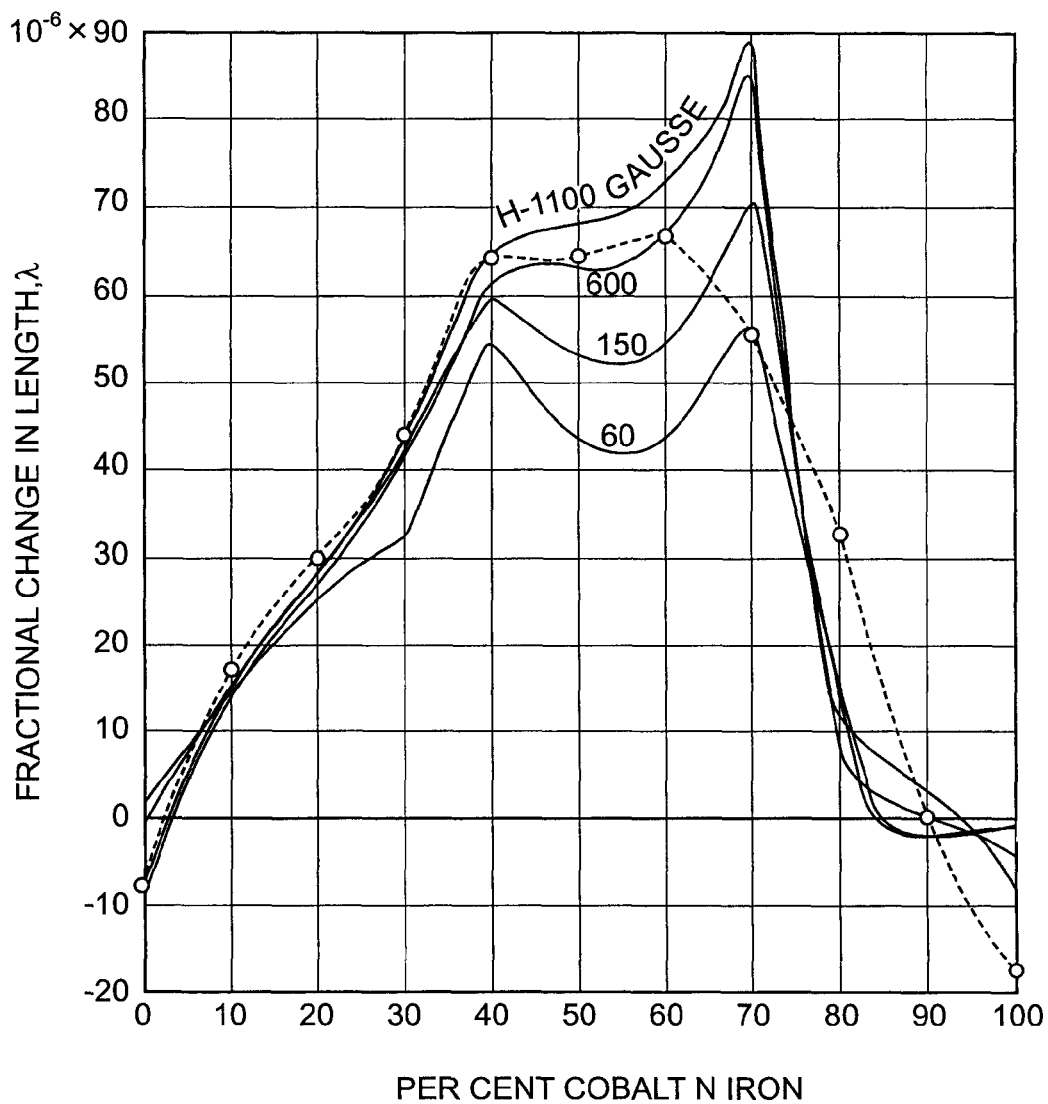
FIG. 34 is a chart showing relationships between the composition and magnetostriction constant in magnetic materials made of CoFe.

Taking account of the fact that the direction of magnetization of the free magnetization layer 17 varies according to the change in the track width W1 of the sensor film 10 and thereby changes the resistance value of the sensor film 10, the magnetic film sensor 100 detects the pressure F (as will be explained later in detail). The relationship between the composition and magnetostriction constant in magnetic materials made of CoFe as in the free magnetization layer 17 will be illustrated, for example, by FIG. 34.

Here, in magnetic materials used in the sensor film 10, the magnetostrictive parameter takes a value ranging from −0.000001 to +0.000001. The magnetostrictive parameter at 0 (zero) means that there is no magnetic change at all with respect to expansion and shrinkage. This is referred to as "zero magnetostriction". In this embodiment, the magnetic material used in the sensor film 10 is assumed to have a positive magnetostriction characteristic, and thus is easier to magnetize in the expanded direction.

When a downward pressure F1 (whose direction will be referred to as positive direction) is applied to the sensor film 10 on the upper side as shown in FIG. 7(A), the sensor film 10 deforms, i.e., curves, into a downward convex arch such that both end parts are drawn toward the center together with the buffer insulating layer 3. In this case, the sensor film 10 shrinks widthwise, thereby decreasing the track width W1.

When an upward pressure F2 (whose direction will be referred to as negative direction) is applied to the sensor film 10 on the upper side (i.e., the pressure applied so far is lowered) as shown in FIG. 7(B), on the contrary, the sensor film 10 deforms, i.e., curves, into an upward convex arch such that the center part is drawn together with the buffer insulating layer 3. In this case, the sensor film 10 stretches widthwise, thereby increasing the track width W1.

When the free magnetization layer 17 has a magnetostriction, the track width W1 of the sensor film 10 increases or decreases according to the external pressure F as mentioned above. This causes such a phenomenon that the free magnetization layer 17 becomes easier or harder to magnetize according to changes in the magnitude of the track width W1. This point will be explained with reference to FIG. 8.

This embodiment assumes a case where the free magnetization layer 17 is constructed by a material having a positive magnetostriction. Therefore, when the sensor film 10 is stretched widthwise as shown in FIG. 8(B), the free magnetization layer 17 becomes easier to magnetize in the stretched width direction, whereby the direction of magnetization is likely to be strongly influenced by the widthwise magnetic field. Then, even when the perpendicular bias magnetic field H1 in a longitudinal direction intersecting the width direction is applied to the free magnetization layer 17 (see FIG. 4), the influence of the perpendicular bias magnetic field H1 becomes relatively small, so that the magnetization is easier to orient in the width direction.

When the sensor film 10 is shrunk widthwise as shown in FIG. 8(A), on the contrary, the free magnetization layer 17 is harder to magnetize in the shrunk width direction. In this case, the free magnetization layer 17 is harder to be influenced by the widthwise magnetic field, so that the influence of the perpendicular bias magnetic field H1 becomes relatively large, whereby the magnetization is easier to orient in the longitudinal direction.

On the other hand, the permanent magnet bias layer 11 applies the perpendicular bias magnetic field H1 to the GMR film 8. The perpendicular bias magnetic field H1 applied to the GMR film 8 will now be explained with reference to FIG. 6.

In this embodiment, a thin film made of a permanent magnet such as the permanent magnet bias layer 11 is formed adjacent to the GMR film 8 in order to apply the perpendicular bias magnetic field H1 to the GMR film 8 as is also shown in FIG. 6(A). Therefore, when the permanent magnet bias layer 11 is magnetized in the direction of arrow a1 in FIG. 6(A), the bias magnetic field H1 in the direction of arrow a2 is applied to the GMR film 8 by magnetostatic coupling. The bias magnetic field H1 is orthogonal to the magnetostatic field H3 and thus is referred to as perpendicular bias magnetic field in this embodiment.

It is desirable to take account of the following point when applying the perpendicular bias magnetic field H1 to the GMR film 8. In general, magnetic materials have a property of changing their resistance value according to the magnitude of bias magnetic field applied thereto and varying the ratio of change in the resistance value depending on the expansion and shrinkage of the length. The GMR film 8 has such a property that the change in resistance value of the sensor film 10 becomes steep and gentle when the track width W1 of the sensor film 10 is smaller and greater as shown in FIGS. 9(A) and 9(B), respectively.

When the magnitude of bias magnetic field is set too large, however, the range (width of fluctuation of resistance value) by which the resistance value changes according to the magnitude of bias magnetic field becomes smaller.

When the bias magnetic field is thus made too large, only the resistance value (resistance value R1 in FIG. 10(A) or resistance value R2 in FIG. 10(B)) determined by the maximum resistance change amount (MR change ratio) always appears as a detected value, which makes it difficult to yield a desirable change in resistance value. In view of this point, it is necessary that the bias magnetic field be set to such a magnitude that the resistance value is not saturated even in the state where the track width W1 of the sensor film 10 is minimized so that the free magnetization layer 17 is the easiest to magnetize.

The output of the magnetic film sensor 100 is given as a voltage value which is a product of the resistance value of the sensor film 10 and the sense current Is. Therefore, the output value of the magnetic film sensor 100 can be raised by increasing the sense current Is or the track width W1 of the sensor film 10. Since the resistance value becomes higher as the thickness of the sensor film 10 decreases, the thickness of the sensor film 10 may be made smaller.

Operations of Magnetic Film Sensor

Operations of the magnetic film sensor 100 will now be explained while being mainly focused on those of the sensor film 10.

The magnetic film sensor 100 is actuated while in a state where the sense current Is is fed to the sensor film 10 through the electrodes 6, 7. Here, as shown in FIG. 5(B), the sense current Is flows through the nonmagnetic metal layer 16 in the Y direction, thereby generating the current magnetic field H2 concentrically surrounding the sense current Is by the right-handed screw rule (see FIG. 4).

The sensor film 10 is in the following state when no external force F is applied thereto. Namely, the magnetization of the fixed magnetization layer 15 is fixed to the direction d15 as shown in FIG. 5(A). The magnetization of the free magnetization layer 17 is oriented in the direction d17 because of the external magnetic field.

Here, the perpendicular magnetic field H1 and current magnetic field H2 are oriented in the Y direction, whereas the magnetostatic field H3 is oriented in the X direction. The external magnetic field is a composite magnetic field constructed by the perpendicular bias magnetic field H1, current magnetic field H2, and magnetostatic field H3. In this embodiment, the sense current Is is adjusted, such that the composite magnetic field is set to a direction tilted by about 45 degrees from the X direction to the Y direction. The magnetization of the free magnetization layer 17 is oriented in a direction along the external magnetic field, i.e., the direction d17 as with the external magnetic field. In this case, the angle $\theta$ formed between the direction of magnetization of the fixed magnetization layer 15 and the direction of magnetization of the free magnetization layer 17 is $\theta 1$ (about 135 degrees).

Suppose that the pressure F1 in the positive direction is exerted on the sensor film 10. The sensor film 10 is arranged so as to stride across the cavity 2 in this case. Since the cavity 2 has an appropriate depth, the forming of the cavity 2 on the surface of the insulating layer 1 eliminates obstacles to deforming the sensor film 10, thereby making it easier for the sensor film 10 to deform. Namely, in the insulating layer 1, the cavity 2 acts as a deformable part which allows the sensor film 10 to deform.

Therefore, the sensor film 10 sensitively reacts to the pressure F1 even when it is weak, thereby deforming accurately. Also, the sensor film 10 is formed on the buffer insulating layer 3 and thus is supported by the buffer insulating layer 3 when deformed.

When the pressure F1 in the positive direction is exerted on the sensor film 10, the track width W1 of the sensor film 10 becomes smaller, whereby the free magnetization layer 17 is harder to magnetize in the width direction. In this case, the free magnetization layer 17 is easier to magnetize in the longitudinal direction and thus is more likely to be influenced by the perpendicular bias magnetic field H1 and current magnetic field H2, whereby the direction of magnetization shifts from the direction d17 to the Y direction. For example, the direction of magnetization of the free magnetization layer 17 becomes a direction 17a shown in FIG. 5(C) in this case.

Therefore, the angle $\theta$ between the direction of magnetization of the fixed magnetization layer 15 and the direction of magnetization of the free magnetization layer 17 changes from $\theta 1$ to $\theta_2$ (about 180 degrees) ($\theta 1 < \theta 2$).

Meanwhile, it has been known that the angle $\theta$ between the direction of magnetization of the fixed magnetization layer 15 and the direction of magnetization of the free magnetization layer 17 and the resistance value R of the sensor film 10 have a relationship of $R=(1-\cos\theta)/2$ therebetween.

Therefore, the resistance value R varies as the angle $\theta$ changes from $\theta 1$ to $\theta 2$ as mentioned above. Since $\cos\theta$ is about $-0.707$ and about $-1$ when the angle $\theta$ is $\theta 1$ and $\eta 2$, respectively, the resistance value R changes from about 0.853 to 1.

Suppose that the pressure F2 in the negative direction is exerted on the sensor film 10 on the contrary. Then, the track width W1 of the sensor film 10 becomes greater, thereby making it easier to magnetize the free magnetization layer 17 in the width direction. This makes the free magnetization layer 17 more susceptible to the magnetostatic field H3, so that the magnetization shifts toward a direction opposite from the Y direction (not depicted), thereby making the angle $\theta$ smaller than $\theta 1$. Therefore, the resistance value R becomes smaller than that in the initial state.

Thus, in the magnetic film sensor 100, the track width W1 of the sensor film 10 changes according to the pressure F, and the resistance value R varies in response to the change in the track width W1. The output of the magnetic film sensor 100 is given as a voltage value V which is a product of the resistance value R of the sensor film 10 and the sense current Is, whereby changes in the resistance value R are taken out as changes in the voltage value V. The sensor film 10 sensitively reacts to the pressure F even when it is weak, thereby deforming accurately, which causes the resistance value R to change, whereby the magnetic film sensor 100 achieves a high accuracy in pressure detection. The magnetic film sensor 100 is suitable as a sensor requiring a high sensitivity such as a touch sensor for a robot. In particular, using the GMR film 8 can increase the width of fluctuation of resistance value (raise the MR change ratio), whereby the accuracy in pressure detection can be made higher.

Modified Example 1

When applying the perpendicular bias magnetic field H1 to the GMR film 8, a soft magnetic layer 19 known as soft adjacent layer (SAL) may be formed as a sensor film 20 instead of the permanent magnet bias layer 11 as shown in FIG. 6(B).

For preventing currents from flowing through the soft magnetic layer 19, an insulating layer 12 (or a thin film made of Ta in a high-resistance phase) is also held between the soft magnetic layer 19 and the GMR film 8 in this sensor film 20 as shown in FIG. 6(B).

In the sensor film 20, the sense current Is flows from the front side to back side of the paper, thereby generating the current magnetic field H2 by the right-handed screw rule. Then, the soft magnetic layer 19 is magnetized to the direction of arrow a1 by the current magnetic field H2. When the magnetization of the soft magnetic layer 19 changes, so that a magnetic pole occurs in an end part, the perpendicular bias magnetic field H1 in the direction of arrow a2 is applied to the GMR film 8.

Modified Example 2

FIG. 11 is a perspective view schematically showing other magnetic film sensors, in which (A) and (B) illustrate magnetic film sensors 101 and 102, respectively.

The magnetic film sensor 101 differs from the magnetic film sensor 100 in that it is free of the buffer insulating layer 3 and the permanent magnet layers 4, 5. The magnetic film sensor 101 differs from the magnetic film sensor 100 also in that it has electrodes 26, 27 having forms different from those of the electrodes 6, 7 and in that the track width W1 of the magnetic film sensor 100 is smaller.

Since the magnetic film sensor 101 does not have the buffer insulating layer 3, the sensor film 10 is easier to deform than in the magnetic film sensor 100, by which the sensor film 10 has a better sensitivity. The end parts of the electrodes 26, 27 on the side of the end face S of the sensor film 10 are partly cut, so as to yield cutout end faces 26a, 27a. Therefore, the sense current Is is easier to flow through the electrodes 26, 27. Since there are no permanent magnet layers 4, 5, the output loss can be prevented from being caused by the sense current Is flowing through the permanent magnet bias layer 11. In the other points, the magnetic film sensor 101 exhibits the same operations and effects as with the magnetic film sensor 100.

The magnetic film sensor 102 differs from the magnetic film sensor 101 in that it has permanent magnet layers 24, 25. Therefore, the magnetic film sensor 102 can lower the Barkhausen noise of the free magnetization layer 17. In the other points, the magnetic film sensor 102 also exhibits the same operations and effects as with the magnetic film sensor 100.

Though not depicted, not only the magnetic film sensors 101, 102 but also the above-mentioned magnetic film sensor 100 may use MR, TMR (tunneling magnetoresistive), and AMR (anisotropic magnetoresistive) films instead of the GMR film 8.

Method of Manufacturing Magnetic Film Sensor

A method of manufacturing the magnetic film sensor 100 having the above-mentioned structure will now be explained with reference to FIGS. 12 to 15 together with FIGS. 1(A) and (B) mentioned above.

Here, FIGS. 12 to 15 are sectional views corresponding to FIG. 1(B) in respective steps of manufacturing the magnetic film sensor 100.

Figure 12:
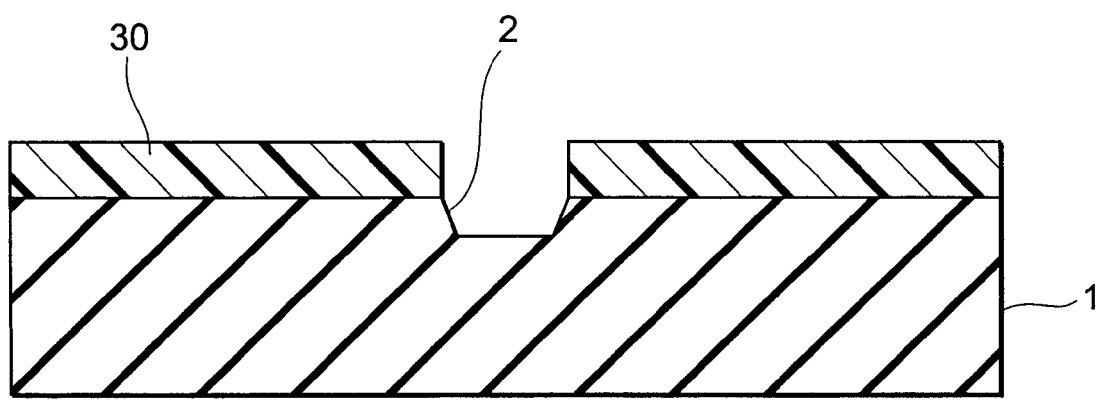
FIG. 12 is a sectional view corresponding to FIG. 1(B) in a step of manufacturing the magnetic film sensor in accordance with the first embodiment.

First, in the manufacturing method in accordance with this embodiment, a photoresist is applied to the whole surface of the insulating layer 1 made of alumina ($Al_2O_3$), $SiO_2$, or the like as shown in FIG. 12. Thereafter, exposure and development are performed with a predetermined photomask, so as to form a resist pattern 30 exposing the surface of the insulating layer 1 in a form corresponding to the cavity 2. Then, using the resist pattern 30 as a mask, reactive ion etching (hereinafter referred to as "RIE") is performed (with $BCL_3$ in this case), so that the surface part of the insulating layer 1 not covered with the resist pattern 30 is partly removed. This forms the cavity 2.

Figure 13:
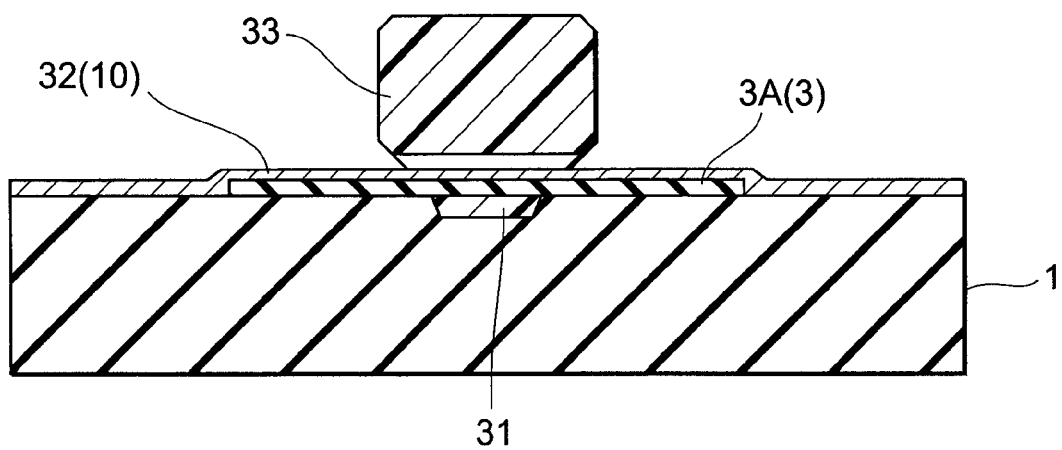
FIG. 13 is a sectional view showing a step subsequent to FIG. 12.

Subsequently, as shown in FIG. 13, a photoresist 31 for filling the cavity 2 is applied, a coating 3A made of an insulating material such as alumina ($Al_2O_3$) or $SiO_2$ is formed thereafter on the whole surface of the insulating layer 1, and unnecessary parts of the coating 3A are removed, whereby the buffer insulating layer 3 is formed.

Further, a sensor layer 32 for forming the sensor film 10 is formed on the whole surface of the insulating layer 1. Thereafter, a photoresist is applied to the whole surface of the sensor layer 32. Further, exposure and development are performed with a predetermined photomask, so as to form a resist pattern 33 such as to leave a photoresist in the part corresponding to the sensor film 10. Etching with the resist pattern 33 is performed for the sensor layer 32, so as to remove the part of the sensor layer 32 not covered with the resist pattern 33.

Figure 14:
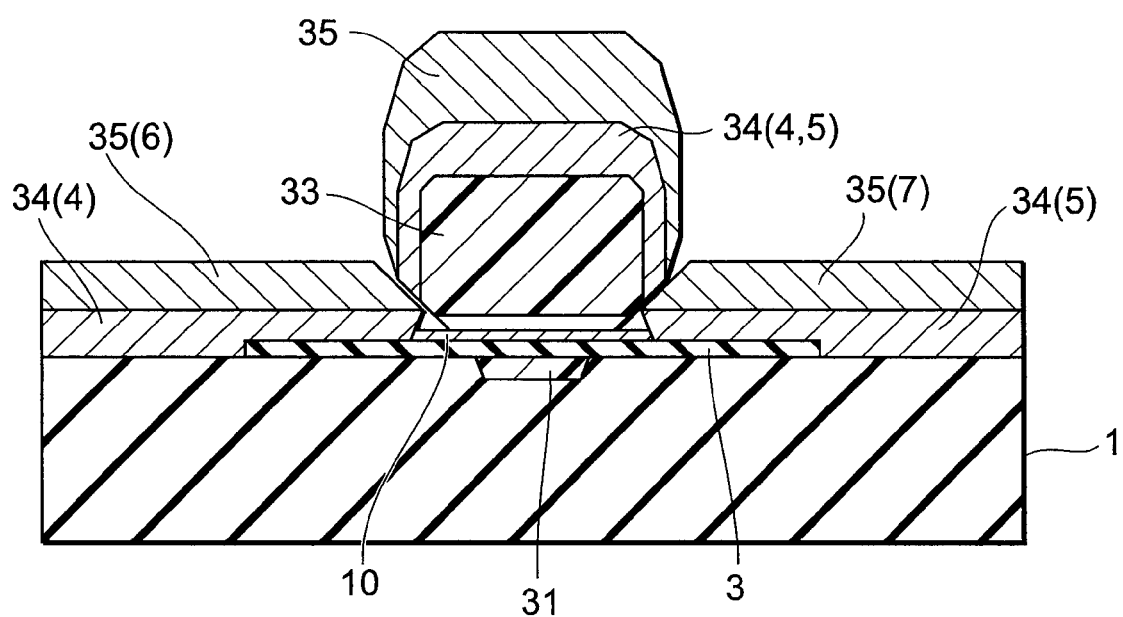
FIG. 14 is a sectional view showing a step subsequent to FIG. 13.

Next, as shown in FIG. 14, a magnetic layer 34 is formed on the whole surface of the insulating layer 1 by sputtering or the like with a magnetic material for forming the permanent magnet layers 4, 5. Subsequently, a conductive layer 35 is formed on the whole surface of the insulating layer 1 by sputtering or the like with a conductive material for forming the electrodes 6, 7.

Figure 15:
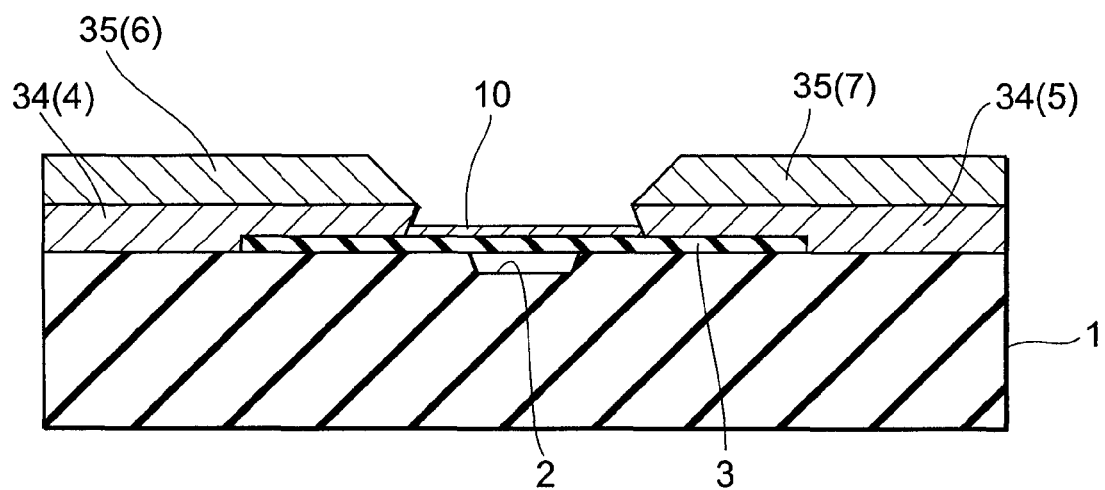
FIG. 15 is a sectional view showing a step subsequent to FIG. 14.

Next, liftoff is performed with a material for dissolving the photoresist 31 and resist pattern 33, so as to remove the photoresist 31 and resist pattern 33. Here, the magnetic layer 34 and conductive layer 35 covering the resist pattern 33 are removed together with the resist pattern 33. Thus, the state shown in FIG. 15 is obtained. Performing the liftoff forms the cavity 2, whereas the holes 2a, 2b are formed at the bottom part of the cavity 2 by the liftoff.

Further, unnecessary parts are removed from the remaining magnetic layer 34 and conductive layer 35 by etching or the like, so as to form the permanent magnet layers 4, 5 and electrodes 6, 7. Thus, the magnetic film sensor 100 is obtained.

Thus obtained magnetic film sensor 100 has the above-mentioned structure, thereby exhibiting a high accuracy in pressure detection, and is suitable as a sensor requiring a high sensitivity such as a touch sensor for a robot.

Manufacturing the magnetic film sensor 100 as in the foregoing makes it possible to produce the magnetic film sensor 100 together with other semiconductor devices.

Second Embodiment

Manufacture of Magnetic Film Sensor 103

The structure of a magnetic film sensor 103 in accordance with a second embodiment of the present invention will now be explained with reference to FIG. 16. FIG. 16 shows the magnetic film sensor 103 in accordance with the second embodiment, in which (A) is a plan view illustrating a major part of the magnetic film sensor 103, and (B) is a sectional view taken along the line B-B of (A). For convenience of illustration, FIG. 16(A) omits the insulating layer 1 and a coating 41 which will be explained later.

The magnetic film sensor 103 is the same as the magnetic film sensor 100 in the first embodiment except that it has a sensor film 40 instead of the sensor film 10 and in that permanent magnet layers 4, 5 are in contact with the upper face of the sensor film 40. The sensor film 40 is the same as the sensor film 10 except that it has a track width W3 greater than the track width W1. Since the track width W3 of the sensor film 40 is greater than the track width W1 of the sensor film 10 (W3>W1), changes in the resistance value R are greater in the sensor film 40 than in the sensor film 10. Therefore, the magnetic film sensor 103 not only exhibits the same operations and effects as with the magnetic film sensor 100, but also yields a pressure detection accuracy higher than that of the magnetic film sensor 100 because of the greater changes in the resistance value R in the sensor film 40.

Method of Manufacturing Magnetic Film Sensor 103

A method of manufacturing the magnetic film sensor 103 having the above-mentioned structure will now be explained with reference to FIGS. 17 to 23 together with FIGS. 16(A) and (B) mentioned above.

Here, FIGS. 17 to 23 show sectional views corresponding to FIG. 16(B) in respective steps of manufacturing the magnetic film sensor 103.

Figure 17:
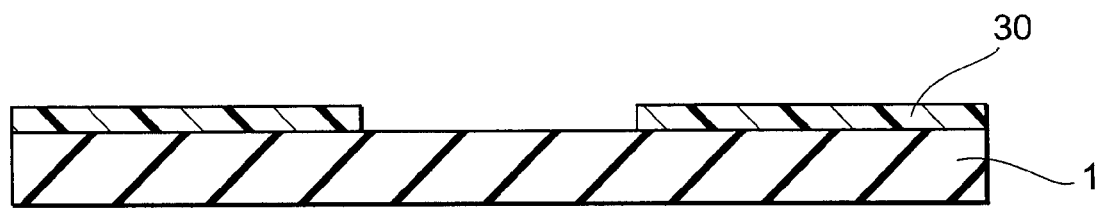
FIG. 17 is a sectional view corresponding to FIG. 1(B) in a step of manufacturing the magnetic film sensor in accordance with the second embodiment.
Figure 18:
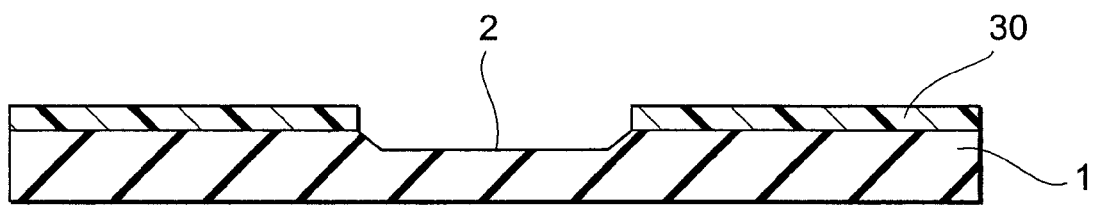
FIG. 18 is a sectional view showing a step subsequent to FIG. 17.

First, in the manufacturing method in accordance with this embodiment, a photoresist is applied to the whole surface of the insulating layer 1 as shown in FIG. 17. Thereafter, exposure and development are performed with a predetermined photomask, so as to form a resist pattern 30 exposing the surface of the insulating layer 1 into a form corresponding to the cavity 2. Then, using this resist pattern 30 as a mask, RIE is performed as in the first embodiment, so that the surface part of the insulating layer not covered with the resist pattern 30 is partly removed. Thus, the cavity 2 is formed as shown in FIG. 18.

Figure 19:
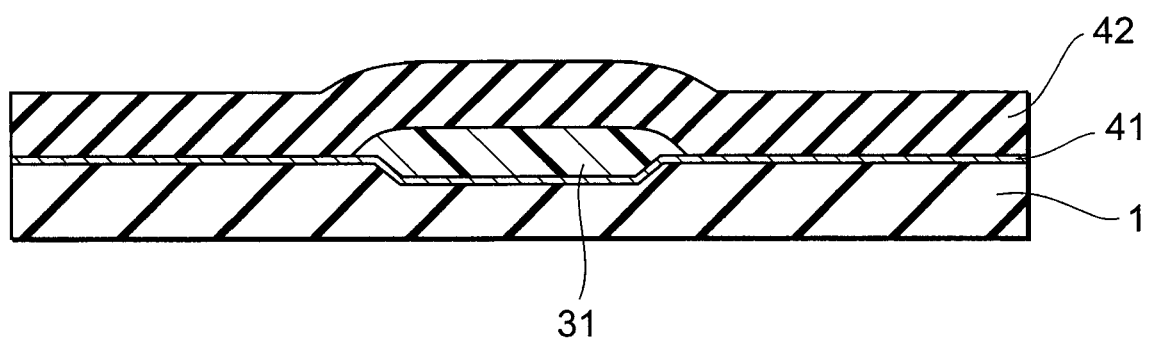
FIG. 19 is a sectional view showing a step subsequent to FIG. 18.
Figure 20:
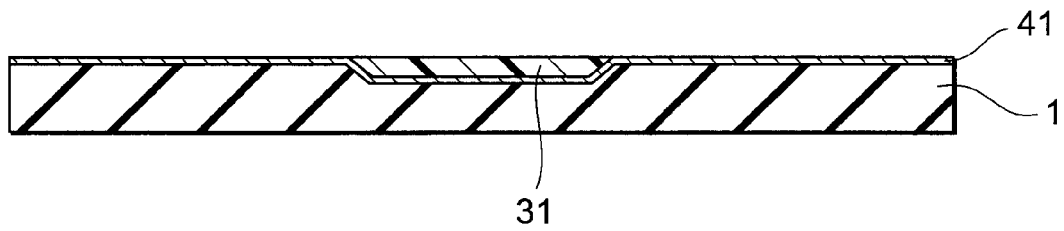
FIG. 20 is a sectional view showing a step subsequent to FIG. 19.

Next, as shown in FIG. 19, a coating 41 is formed on the whole surface of the insulating layer 1. This coating 41 is formed by Ru, and acts as a stopper for chemical mechanical polishing (hereinafter referred to as "CMP"). Subsequently, a photoresist 31 for filling the cavity 2 is applied, and then a coating 42 made of alumina (Al$_2$O$_3$) is formed on the whole surface of the insulating layer 1. Next, as shown in FIG. 20, the whole surface of the insulating layer 1 is polished by CMP, so as to flatten the surface.

Figure 21:
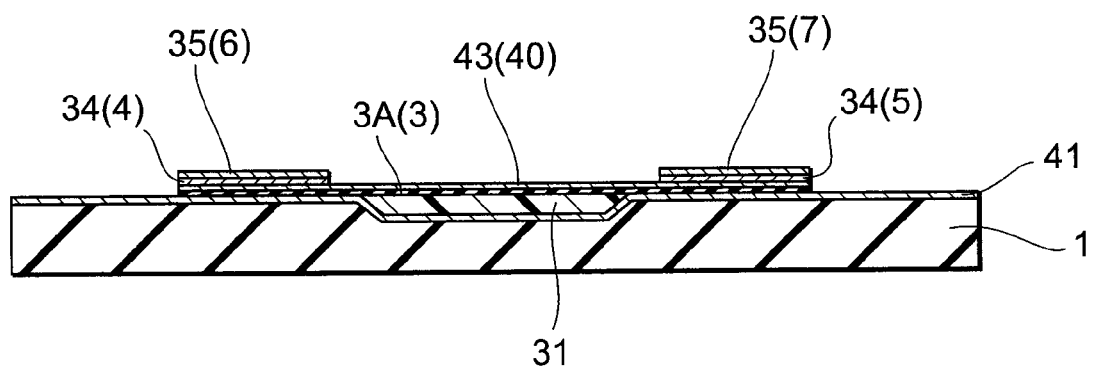
FIG. 21 is a sectional view showing a step subsequent to FIG. 20.

Further, as shown in FIG. 21, a coating 3A made of an insulating material such as alumina (Al$_2$O$_3$) or SiO$_2$ is formed on the whole surface of the insulating layer 1, and unnecessary parts of the coating 3A are removed, whereby the buffer insulating layer 3 is formed. Also, a sensor layer 43 for forming the sensor film 40 is formed on the buffer insulating layer 3, and unnecessary parts of the sensor layer 43 are removed, whereby the sensor film 40 is formed.

Next, a photoresist is applied to the whole surface of the insulating layer 1, and exposure and development are performed with a predetermined photomask, so as to form a resist pattern which is not depicted. This resist pattern is formed such as to leave the photoresist in the part not covered with the permanent magnet layers 4, 5 in the sensor film 40. Thereafter, a magnetic layer 34 is formed on the whole surface of the insulating layer 1. This magnetic layer 34 is formed, for example, by sputtering with a magnetic material for forming the permanent magnet layers 4, 5. Subsequently, a conductive layer 35 is formed on the whole surface of the insulating layer 1. The conductive layer 35 is formed, for example, by sputtering with a conductive material for forming the electrodes 6, 7.

Next, liftoff is performed with a material for dissolving the photoresist 31 and resist pattern, so as to remove the photoresist 31 and its resist pattern. Here, the magnetic layer 34 and conductive layer 35 covering the resist pattern are removed together with the resist pattern. Performing the liftoff forms the cavity 2 similar to that in the first embodiment.

Figure 22:
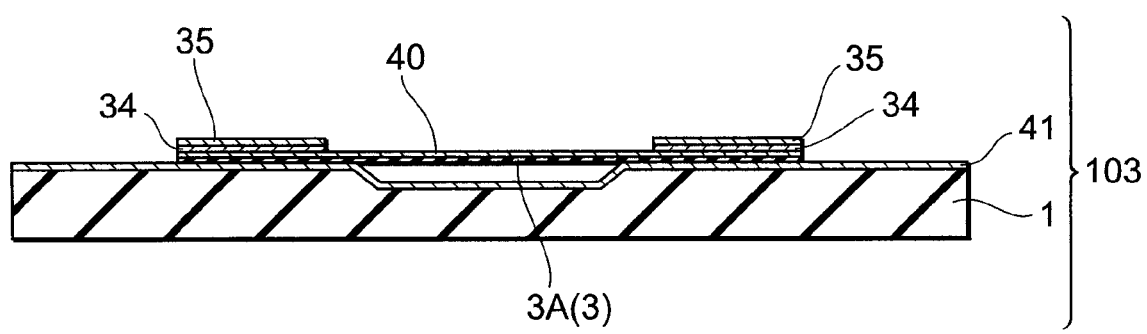
FIG. 22 is a sectional view showing a step subsequent to FIG. 21.

Further, unnecessary parts of the remaining magnetic layer 34 and conductive layer 35 are removed by etching, whereby the magnetic film sensor 103 is obtained as shown in FIG. 22. The foregoing manufacture of the magnetic film sensor 103 yields the same operations and effects as with the manufacture of the magnetic film sensor 100.

Figure 23:
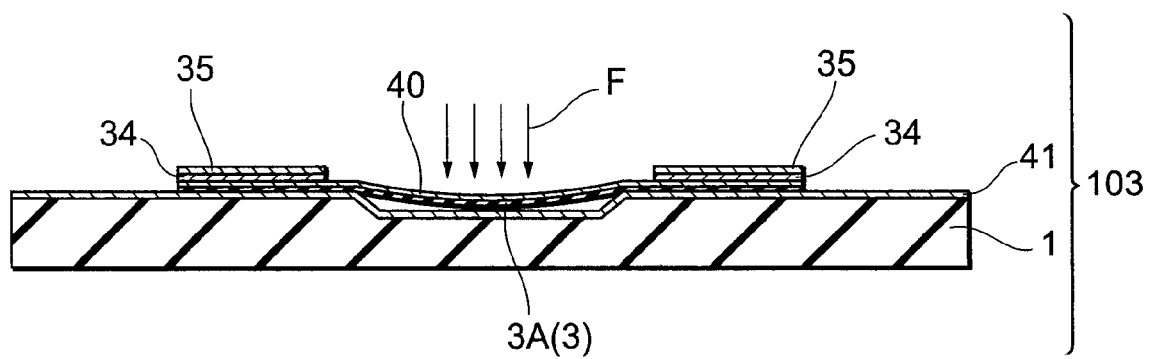
FIG. 23 is a sectional view showing a step subsequent to FIG. 22.

As shown in FIG. 23, the sensor film 40 deforms and changes the track width W3 when an external pressure F is applied thereto, whereby the magnetic film sensor 103 can detect the pressure F with a high accuracy as with the magnetic film sensor 100. Also, since the track width W3 is greater than the track width W1, changes in the resistance value R are greater, whereby the pressure F can be detected with a higher accuracy than by the magnetic film sensor 100.

Modified Example 1

FIG. 24 shows another magnetic film sensor 104, in which (A) is a plan view illustrating a major part of the magnetic film sensor 104, and (B) is a sectional view taken along the line B-B of (A). (C) is a sectional view of still another magnetic film sensor 105 similar to (B).

The magnetic film sensor 104 is the same as the magnetic film sensor 103 in the second embodiment in that it does not have the buffer insulating layer 3. Since the magnetic film sensor 104 does not have the buffer insulating layer 3, the sensor film 40 is easier to deform than the magnetic film sensor 103 and accordingly has a higher sensitivity.

The magnetic film sensor 105 differs from the magnetic film sensor 104 in terms of places where the permanent magnet layers 4, 5, electrodes 6, 7, and sensor film 40 are formed.

The permanent magnet layers 4, 5 and electrodes 6, 7 are formed on the surface of the insulating layer 1 in the magnetic film sensor 104, but are buried in the insulating layer 1 in the magnetic film sensor 105. The sensor film 40 is formed in contact with the buried permanent magnet layers 4, 5.

The permanent magnet bias layer 11 is formed on the surface of the insulating layer 1 in the magnetic film sensor 104, but faces the outside in the magnetic film sensor 105. Therefore, when the pressure F in the positive direction is applied, the track width W3 of the sensor film 40 decreases in the magnetic film sensor 104 but increases in the magnetic film sensor 105. Hence, the resistance value R changes differently between the magnetic film sensors 104 and 105.

Third Embodiment

Manufacture of Magnetic Film Sensor 106

Figure 25:
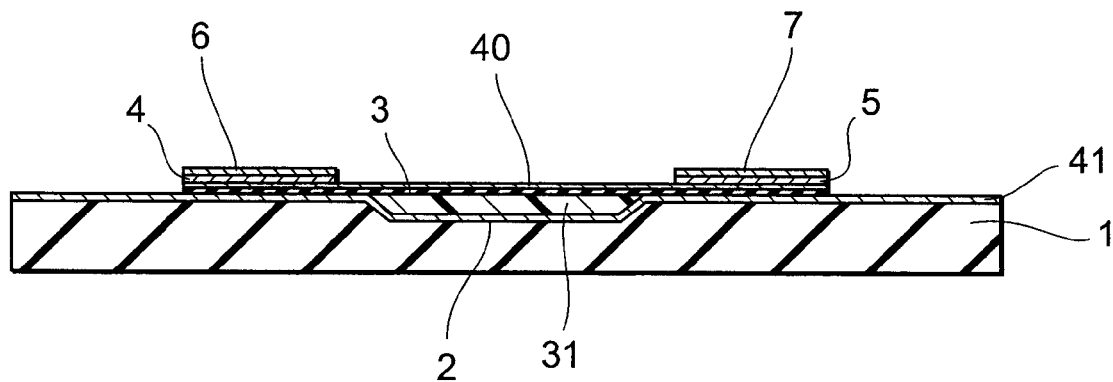
FIG. 25 is a sectional view, similar to FIG. 1(B), showing a magnetic film sensor in accordance with a third embodiment of the present invention.
Figure 26:
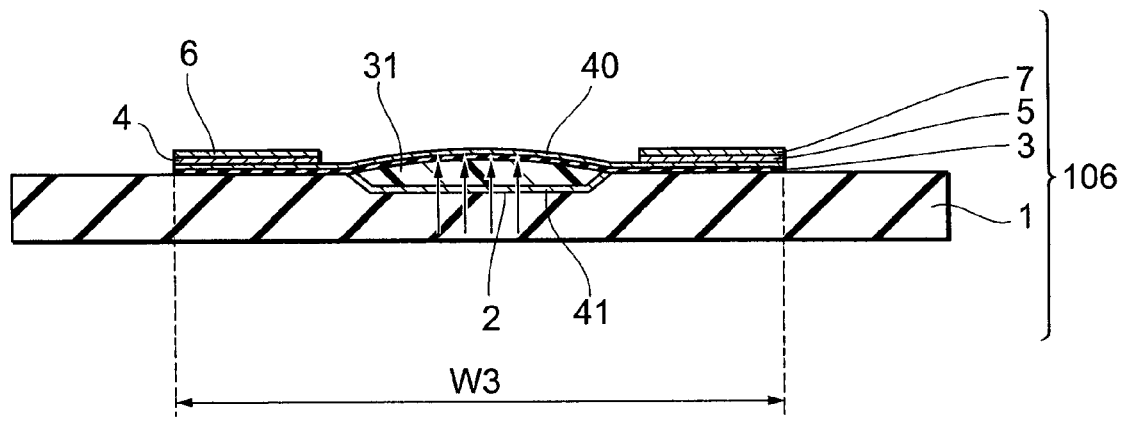
FIG. 26 is a sectional view, similar to FIG. 1(B), showing a state where the photoresist of the magnetic film sensor shown in FIG. 25 is inflated.

The structure of a magnetic film sensor 106 in accordance with a third embodiment will now be explained with reference to FIGS. 25 and 26. FIG. 25 is a sectional view, similar to FIG. 1(B), showing the magnetic film sensor 106 in accordance with the third embodiment of the present invention. FIG. 26 is a sectional view, similar to FIG. 1(B), illustrating a state where the photoresist 31 of the magnetic film sensor 106 is inflated. Unlike the magnetic film sensors 100, 103 and the like, the magnetic film sensor 106 is a temperature sensor for detecting temperature.

The magnetic film sensor 106 is the same as the magnetic film sensor 103 except that the width of the cavity 2 is formed greater than that of the cavity 2 of the magnetic film sensor 103 and that the photoresist 31 is buried in the cavity 2.

In the magnetic film sensor 106, the photoresist 31 is buried in the cavity 2. The photoresist 31 is a material softer than the sensor film 40, and is easily deformable by thermal expansion. Therefore, the photoresist 31 is a deformable part which allows the sensor film 40 to deform.

Since the sensor film 40 is formed so as to stride across the photoresist 31 acting as the deformable part in the magnetic film sensor 106, the sensor film 40 deforms when the photoresist 31 inflates because of a change in temperature, thereby changing the length of the sensor film 40. As the track width W3 of the sensor film 40 changes, the resistance value R varies, thereby altering the voltage value V according to changes in temperature.

Therefore, the magnetic film sensor 106 can detect temperature. Since the sensor film 40 reacts sensitively to changes in temperature, the changes in temperature can be detected accurately.

Method of Manufacturing Magnetic Film Sensor 106

The magnetic film sensor 106 can be manufactured by substantially the same procedure as that of the magnetic film sensor 103. For the magnetic film sensor 106, the steps from FIGS. 17 to 20 are executed as in the magnetic film sensor 103. However, the width of the cavity 2 is made greater than that in the magnetic film sensor 103. Then, as shown in FIG. 21, the buffer insulating layer 3 is formed on the surface of the insulating layer 1 as in the magnetic film sensor 103, and the sensor film 40 is further formed.

Subsequently, a photoresist is formed on the whole surface of the insulating layer 1 as in the magnetic film sensor 103, and exposure and development are performed with a predetermined photomask, so as to form a resist pattern similar to that in the magnetic film sensor 103. This resist pattern is formed so as to expose parts in the sensor film 40 where the permanent magnet layers 4, 5 are to be formed. Then, as in the magnetic film sensor 103, the magnetic layer 34 and conductive layer 35 are formed, and the resist pattern is removed thereafter. In this case, the photoresist 31 is not removed. The foregoing yields the magnetic film sensor 106.

Fourth Embodiment

Structure of Magnetic Film Sensor 107

Figure 27:
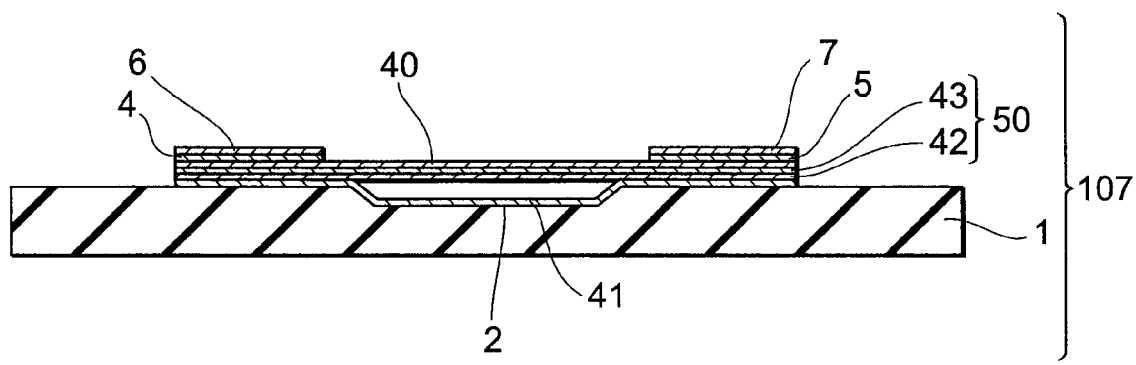
FIG. 27 is a sectional view, similar to FIG. 1(B), showing another magnetic film sensor in accordance with a fourth embodiment of the present invention.
Figure 28:
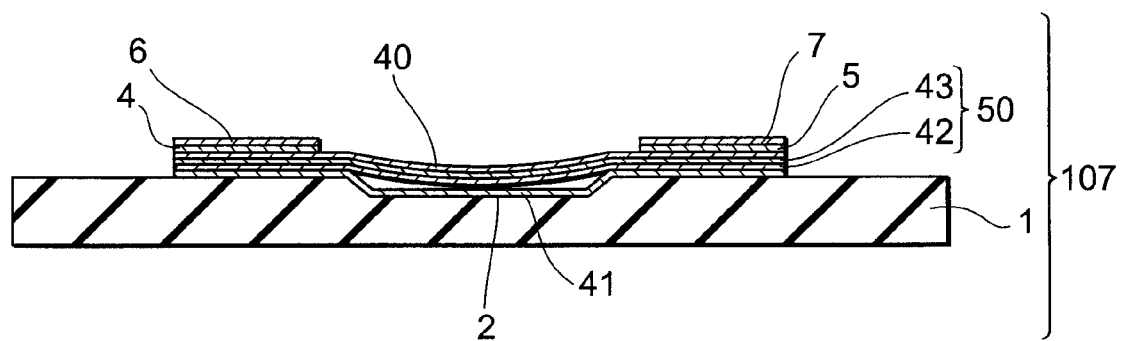
FIG. 28 is a sectional view, similar to FIG. 1(B), showing the magnetic film sensor in a case where the sensor film is shrunk.
Figure 29:
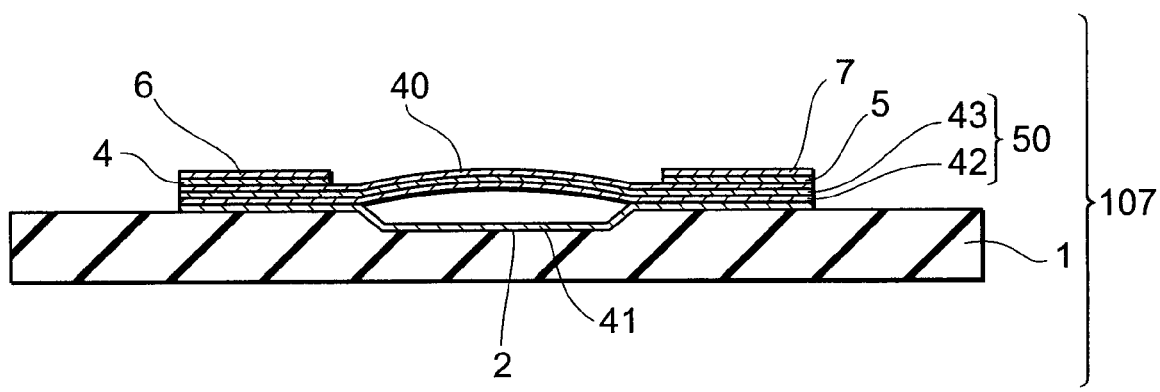
FIG. 29 is a sectional view, similar to FIG. 1(B), showing the magnetic film sensor in a case where the sensor film is stretched.

The structure of a magnetic film sensor 107 in accordance with a fourth embodiment of the present invention will now be explained with reference to FIGS. 27 to 29. FIGS. 27 to 29 are sectional views, similar to FIG. 1(B), showing the magnetic film sensor 107 in accordance with the fourth embodiment of the present invention. The magnetic film sensor 107 is a temperature sensor for detecting temperature as with the magnetic film sensor 106.

The magnetic film sensor 107 differs from the magnetic film sensor 106 in that it does not have the buffer insulating layer 3 but has a bimetal layer 50.

The bimetal layer 50 is one in which two metal layers 42, 43 having different coefficients of thermal expansion are bonded together, and has a two-layer structure in which the metal layers 42, 43 are laminated in this order. The bimetal layer 50 is formed into a rectangular shape as with the sensor film 40. The bimetal layer 50 is arranged under the sensor film 40 and in contact with the permanent magnet bias layer 11, so as to be held between the permanent magnet bias layer 11 and coating 41.

Manganese (Mn), chromium (Cr), copper (Cu), and the like are added to an alloy of iron (Fe) and nickel (Ni), so as to form the metal layers 42, 43 having different coefficients of thermal expansion.

The bimetal layer 50 is one in which two metal layers 42, 43 having different coefficients of thermal expansion are bonded together, and thus has a property of curving differently according to changes in temperature. In this case, the bimetal layer 50 may curve toward the inside of the cavity 2 as shown in FIG. 28 or toward the outside of the cavity 2 as shown in FIG. 29, for example. Since the bimetal layer 50 has such a property, the track width W3 of the sensor film 40 varies according to changes in temperature, whereby the resistance value R of the sensor film 40 changes.

Therefore, the magnetic film sensor 107 alters the voltage value V in response to changes in temperature, and thus can detect temperature. Since the sensor film 40 reacts sensitively to changes in temperature, the changes in temperature can be detected accurately. Because of the bimetal layer 50, this magnetic film sensor reacts to changes in temperature more sensitively than the magnetic film sensor 106, and thus can detect changes in temperature more accurately.

Method of Manufacturing Magnetic Film Sensor 107

Figure 30:
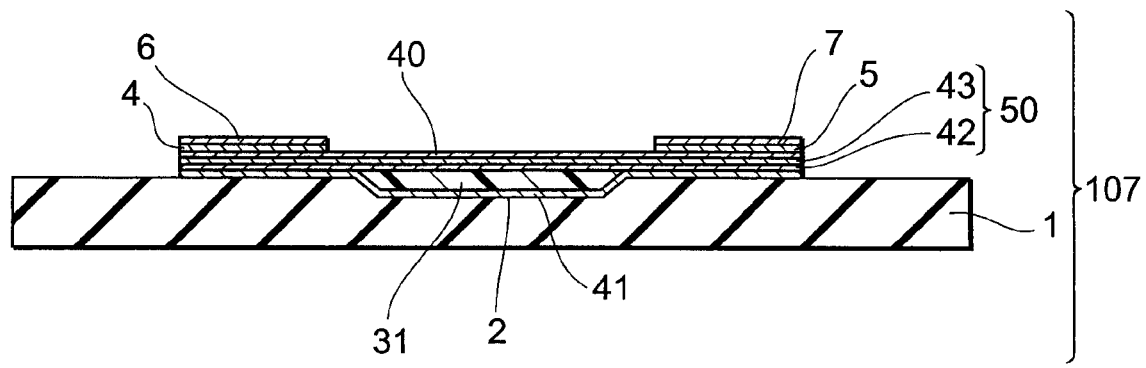
FIG. 30 is a sectional view corresponding to FIG. 1(B) in a step of manufacturing the magnetic film sensor in accordance with the fourth embodiment.

The magnetic film sensor 107 can be manufactured by substantially the same procedure as that of the magnetic film sensor 103. For the magnetic film sensor 107, the steps from FIGS. 17 to 20 are executed as in the magnetic film sensor 103. However, the width of the cavity 2 is made greater than that in the magnetic film sensor 103. Then, the bimetal layer 50 is formed on the surface of the insulating layer 1 as shown in FIG. 30 without forming the buffer insulating layer 3, and the sensor film 40 is formed thereon. Subsequent steps are executed as in the magnetic film sensor 103, whereby the magnetic film sensor 107 is obtained.

Fifth Embodiment

Structure of Magnetic Film Sensor 108

Figure 31:
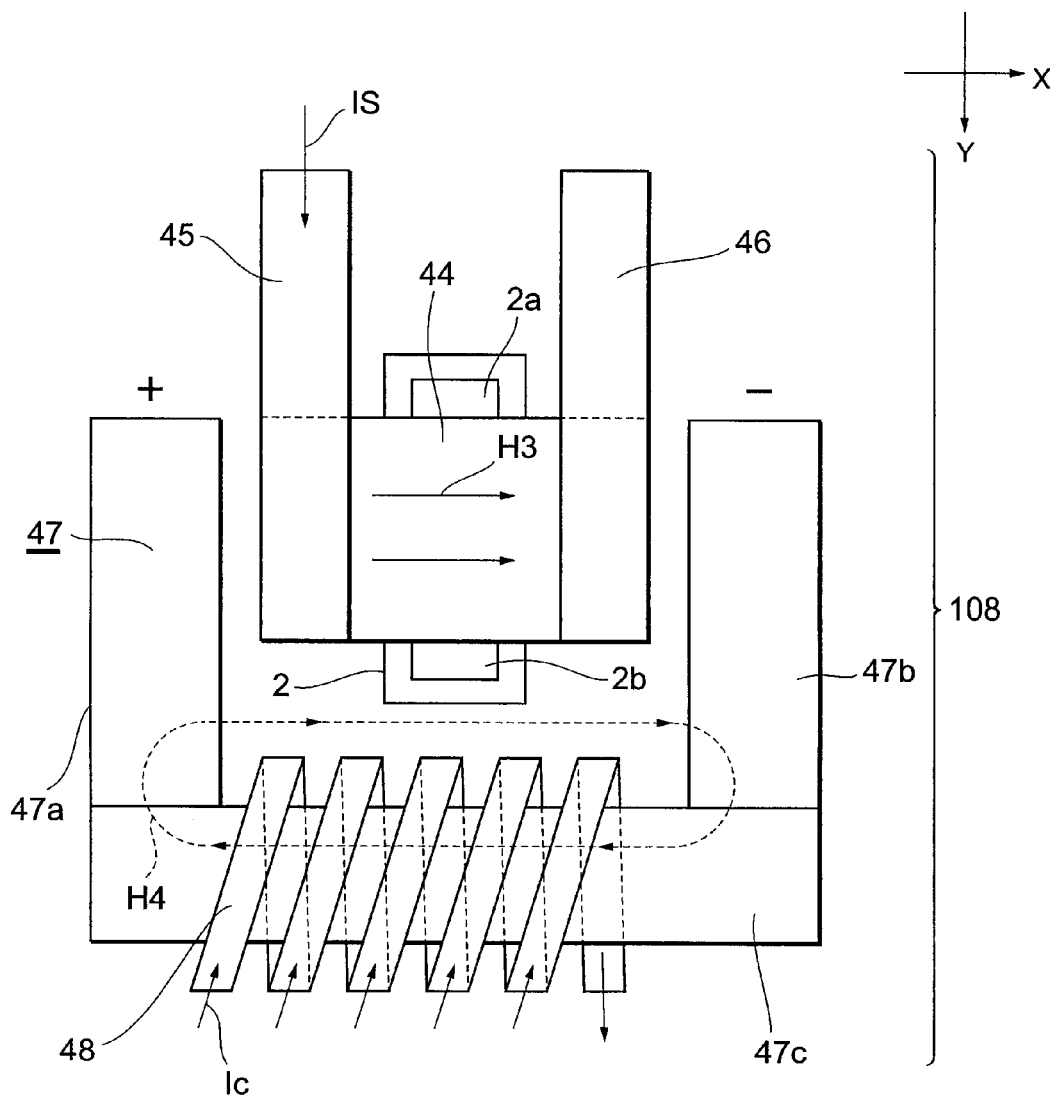
FIG. 31 is a plan view, similar to FIG. 1(A), showing the magnetic film sensor in accordance with a fifth embodiment of the present invention.

A magnetic film sensor 108 in accordance with a fifth embodiment of the present invention will now be explained with reference to FIG. 31. FIG. 31 is a plan view, similar to FIG. 1(A), showing the magnetic film sensor 108 in accordance with the fifth embodiment of the present invention. This magnetic film sensor 108 is a pressure sensor for detecting pressure.

The magnetic film sensor 108 differs from the magnetic film sensor 100 in that it has a permanent magnet layer 47 instead of the permanent magnet layers 4, 5 and electrodes 45, 46 instead of the electrodes 6, 7. The magnetic film sensor 108 also differs from the magnetic film sensor 100 in that it has a sensor film 44 instead of the sensor film 10, that the cavity 2 has a different size, and that it has a coil 48. These magnetic film sensors are the same in the other points.

The electrodes 45, 46 are connected to respective side parts of the sensor film 44 in the width direction. As shown in FIG. 31, the permanent magnet layer 47 has two magnetic parts 47a, 47b as first and second permanent magnet layers extending longitudinally and a magnetic part 47c as a third permanent magnet layer extending widthwise. The permanent magnet layer 47 has a structure in which the magnetic parts 47a, 47b are connected to both sides of the magnetic part 47c and integrated together. The magnetic parts 47a, 47b oppose the electrodes 45, 46, respectively, whereas the sensor film 44 and electrodes 45, 46 are positioned between the magnetic parts 47a, 47b. The coil 48 is wound about the magnetic part 47c as shown in FIG. 31. The coil 48 is a helical coil spirally wound about the magnetic part 47c.

In the magnetic film sensor 108 having the foregoing structure, a magnetostatic field H3 caused by the magnetic parts 47a, 47b is applied as an external magnetic field to the sensor film 44. A current Ic flowing through the coil 48 wound about the magnetic part 47c forms a magnetic field H4, which is also applied to the sensor film 44.

The track width of the sensor film 44 varies according to changes in pressure, so that the sensor film 44 changes its resistance value R, whereby the magnetic film sensor 108 can detect pressure as with the magnetic film sensor 100. Since the sensor film 44 reacts sensitively to the pressure F and deforms accurately, thereby changing the resistance value R, the accuracy in pressure detection is high. The magnetic film sensor 108 is also suitable as a sensor requiring a high sensitivity such as a touch sensor for a robot.

Sixth Embodiment

Structures of Magnetic Film Sensors 109, 110

Figure 32:
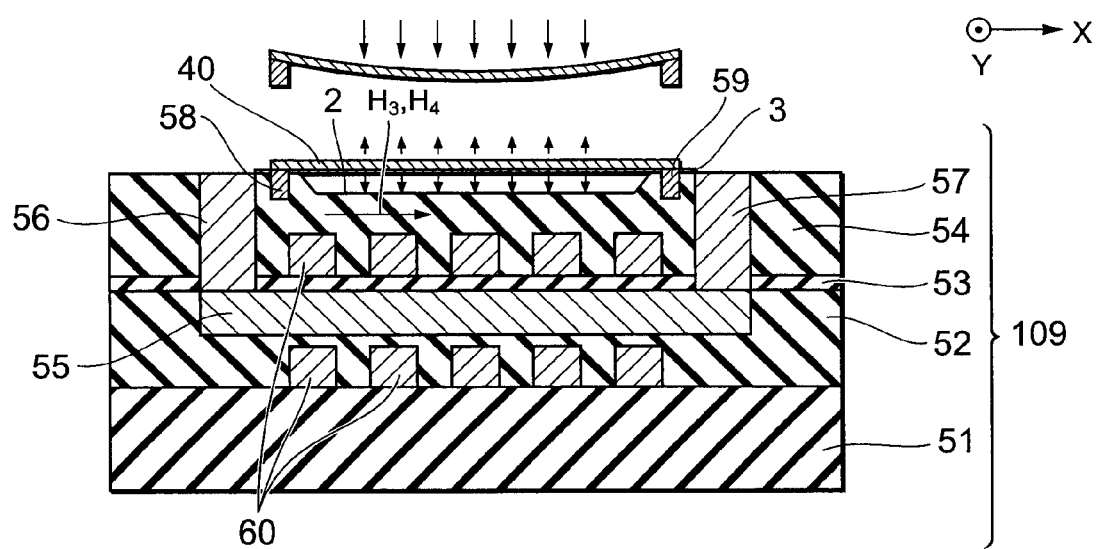
FIG. 32 is a sectional view, similar to FIG. 1(B), showing a magnetic film sensor in accordance with a sixth embodiment of the present invention.
Figure 33:
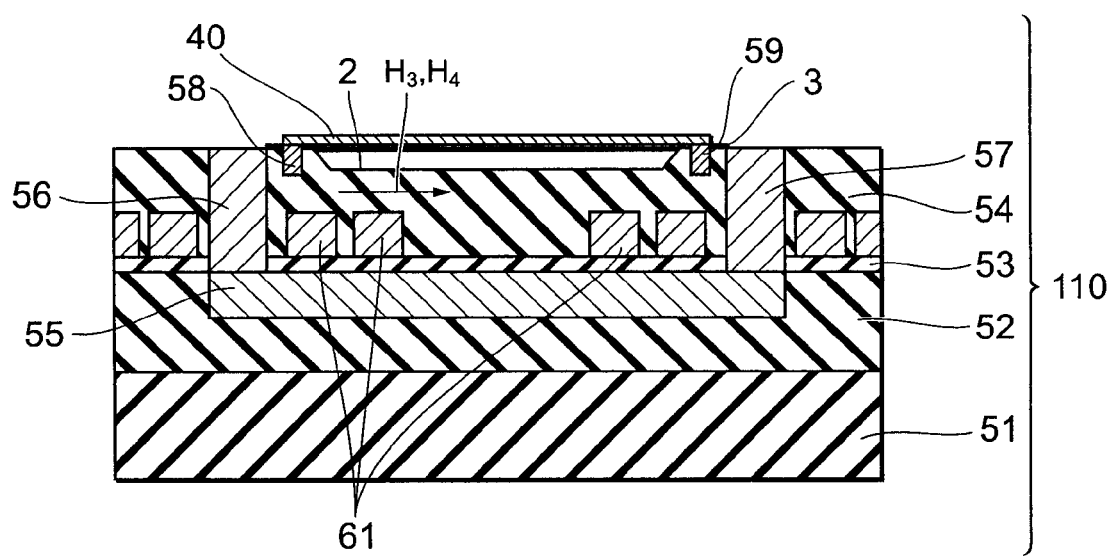
FIG. 33 is a sectional view, similar to FIG. 1(B), showing another magnetic film sensor in accordance with the sixth embodiment of the present invention.

Magnetic film sensors 109, 110 in accordance with a sixth embodiment of the present invention will now be explained with reference to FIGS. 32 and 33. FIG. 32 is a sectional view, similar to FIG. 1(B), showing the magnetic film sensor 109 in accordance with the sixth embodiment of the present invention, whereas FIG. 33 is a sectional view, similar to FIG. 1(B), showing the magnetic film sensor 110. The magnetic film sensors 109, 110 are pressure sensors for detecting pressure.

The magnetic film sensor 109 has insulating layers 51, 52, 53, 54 which are laminated in this order. The magnetic film sensor 110 also has the insulating layers 51, 52, 53, 54 laminated in this order.

Each of the magnetic film sensors 109, 110 has permanent magnet layers 56, 57 as first and second permanent magnet layers buried in the insulating layer 54 and a permanent magnet layer 55 as a third permanent magnet layer 55 buried in the insulating layer 52.

The magnetic film sensors 109, 110, each including electrodes 58, 59 as first and second electrodes, have thin-film coils 60, 61, respectively.

The insulating layer 54 is a depressed insulating layer having a cavity 2 on the surface as with the insulating layer 1. A buffer insulating layer 3 is formed so as to stride across the cavity 2, whereas a sensor film 40 is formed on the buffer insulating layer 3. The electrodes 58, 59 are connected to both end parts of the sensor film 40. The permanent magnet layers 56, 57 are arranged on the outside of the electrodes 58, 59.

In the magnetic film sensor 109, the permanent magnet layers 56, 57 are connected to the permanent magnet layer 55. The thin-film coil 60 is wound about and surrounds the permanent magnet layer 55. The thin-film coil 60 is a helical coil.

The permanent magnet layers 56, 57 are also connected to the permanent magnet layer 55 in the magnetic film sensor 110. However, the thin-film coil 61 is formed about the permanent magnet layers 56, 57 in the magnetic film sensor 110. The thin-film coil 61 is a spiral coil formed about an unshown axis so as to be wound around the permanent magnet layers 56, 57.

In the magnetic film sensors 109, 110, a magnetostatic field formed by the permanent magnet layers 56, 57 as a magnetostatic field H3 in the X direction and a current magnetic field H4 formed by energization of the thin-film coils 60, 61 are applied to the sensor film 40. When a sense current Is flows through the electrodes 58, 59, a current magnetic field H2 (not depicted in FIG. 32) is also applied to the sensor film 40.

The track width of the sensor film 40 varies according to changes in pressure, so as to alter the resistance value R of the sensor film 40 accordingly, whereby the magnetic film sensors 109, 110 can detect pressure as with the magnetic film sensor 100. The sensor film 40 reacts sensitively to the pressure F and deforms accurately, so that the resistance value R changes accordingly, whereby the magnetic film sensors 109, 110 attain a high accuracy in pressure detection. Therefore, the magnetic film sensors 109, 110 are also suitable as a sensor requiring a high sensitivity such as a touch sensor for a robot.

Though the foregoing embodiments are explained in teems of pressure and temperature sensors by way of example, the present invention is also applicable to acceleration sensors.

For example, an external force corresponding to an acceleration may be exerted on the sensor films 10, 40 of the magnetic film sensors 100, 103, so as to use the magnetic film sensors 100, 103 as acceleration sensors. These acceleration sensors can detect an acceleration occurring when an electronic device such as cellular phone or hard disk drive drops, for example.

It is apparent that various embodiments and modifications of the present invention can be embodied, based on the above description. Accordingly, it is possible to carry out the present invention in the other modes than the above best mode, within the following scope of claims and the scope of equivalents.

What is claimed is:

1. A magnetic film sensor comprising:
   a magnetic film configured to generate a magnetostriction;
   a base layer; and
   a deformable part that is formed using a softer material than the magnetic film, wherein
      the deformable part is formed at least partly on a surface of the base layer, and
      the magnetic film is formed on the base layer so as to stride across the deformable part.

2. A magnetic film sensor according to claim 1, further comprising a buffer insulating layer formed on the surface of the base layer so as to stride across the deformable part, the magnetic film being formed on the buffer insulating layer.

3. A magnetic film sensor according to claim 1, further comprising first and second permanent magnet layers configured to apply a magnetic field along a direction across the deformable part, the first and second permanent magnet layers being arranged on respective sides of the magnetic film in the direction across the deformable part.

4. A magnetic film sensor according to claim 1, further comprising first and second electrodes for energizing the magnetic film, the first and second electrodes being arranged on respective sides of the magnetic film in the direction across the deformable part.

5. A magnetic film sensor according to claim 1, wherein the softer material is a photoresist.

6. A magnetic film sensor according to claim 1, wherein the magnetic film has a rectangular shape.

7. A magnetic film sensor comprising:
- a magnetic film configured to generate a magnetostriction;
- a base layer;
- a deformable part that is formed using a softer material than the magnetic film; and
- first and second permanent magnet layers configured to apply a magnetic field to the magnetic film along a direction across the deformable part, wherein the deformable part is formed at least partly on a surface of the base layer, the magnetic film is formed on the base layer so as to stride across the deformable part, and the magnetic film has a structure in which an insulating layer is held between a GMR film and a bias magnetic field layer for applying a magnetic field in a direction intersecting the magnetic field applied by the first and second permanent magnet layers to the GMR film.

\* \* \* \* \*